(12) United States Patent
Yu et al.

(10) Patent No.: US 9,966,360 B2
(45) Date of Patent: May 8, 2018

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW);
Chun-Hui Yu, Hsinchu County (TW);
Kuo-Chung Yee, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/202,541

(22) Filed: Jul. 5, 2016

(65) Prior Publication Data
US 2018/0012863 A1   Jan. 11, 2018

(51) Int. Cl.
| H01L 21/00 | (2006.01) |
| H01L 25/065 | (2006.01) |
| H01L 23/538 | (2006.01) |
| H01L 23/00 | (2006.01) |
| H01L 23/31 | (2006.01) |
| H01L 27/146 | (2006.01) |
| H01L 25/00 | (2006.01) |
| H01L 21/78 | (2006.01) |
| H01L 21/3105 | (2006.01) |

(Continued)

(52) U.S. Cl.
CPC ...... *H01L 25/0652* (2013.01); *G06K 9/00006* (2013.01); *H01L 21/31051* (2013.01); *H01L 21/6835* (2013.01); *H01L 21/76877* (2013.01); *H01L 21/78* (2013.01); *H01L 23/3157* (2013.01); *H01L 23/5384* (2013.01); *H01L 24/03* (2013.01); *H01L 24/09* (2013.01); *H01L 24/11* (2013.01); *H01L 24/17* (2013.01); *H01L 25/50* (2013.01); *H01L 27/14634* (2013.01); *H01L 27/14636* (2013.01); *H01L 27/14687* (2013.01); *H01L 21/561* (2013.01); *H01L 2221/68331* (2013.01); *H01L 2224/02311* (2013.01); *H01L 2224/02331* (2013.01); *H01L 2224/02333* (2013.01)

(58) Field of Classification Search
CPC .................................................. H01L 25/0652
See application file for complete search history.

(56) References Cited

U.S. PATENT DOCUMENTS

| 7,564,115 B2 | 7/2009 | Chen et al. |
| 7,633,165 B2 | 12/2009 | Hsu et al. |

(Continued)

*Primary Examiner* — William Harriston
(74) *Attorney, Agent, or Firm* — JCIPRNET

(57) ABSTRACT

A semiconductor package and a manufacturing method for the semiconductor package are provided. The semiconductor package has a first redistribution layer, a first die over the first redistribution layer, a molding compound encapsulating at least one second die and at least one third die disposed on the first redistribution layer, and at least one fourth die and conductive elements connected to the first redistribution layer. Through vias of the first die are electrically connected to through interlayer vias penetrating through the molding compound and are electrically connected to the first redistribution layer. The semiconductor package may further include a second redistribution layer disposed on the molding compound and between the first die, the second die and the third die.

20 Claims, 19 Drawing Sheets

(51) Int. Cl.
  *H01L 21/768* (2006.01)
  *H01L 21/683* (2006.01)
  *G06K 9/00* (2006.01)
  *H01L 21/56* (2006.01)

(56) References Cited

U.S. PATENT DOCUMENTS

| | | | |
|---|---|---|---|
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,361,842 B2 | 1/2013 | Yu et al. | |
| 8,426,961 B2 | 4/2013 | Shih et al. | |
| 8,669,174 B2 | 3/2014 | Wu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,802,504 B1 | 8/2014 | Hou et al. | |
| 8,803,292 B2 | 8/2014 | Chen et al. | |
| 8,803,306 B1 | 8/2014 | Yu et al. | |
| 8,803,316 B2 | 8/2014 | Lin et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2008/0042227 A1* | 2/2008 | Asano | H01L 27/14618 257/432 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0001645 A1 | 1/2014 | Lin et al. | |
| 2014/0203429 A1 | 7/2014 | Yu et al. | |
| 2014/0210107 A1* | 7/2014 | Zhai | H01L 23/49827 257/777 |
| 2014/0225222 A1 | 8/2014 | Yu et al. | |
| 2014/0225258 A1 | 8/2014 | Chiu et al. | |
| 2014/0252572 A1 | 9/2014 | Hou et al. | |
| 2014/0252646 A1 | 9/2014 | Hung et al. | |
| 2014/0264930 A1 | 9/2014 | Yu et al. | |
| 2015/0262909 A1* | 9/2015 | Chen | H01L 21/6835 257/774 |
| 2015/0287697 A1 | 10/2015 | Tsai et al. | |
| 2015/0348872 A1 | 12/2015 | Kuo et al. | |

* cited by examiner

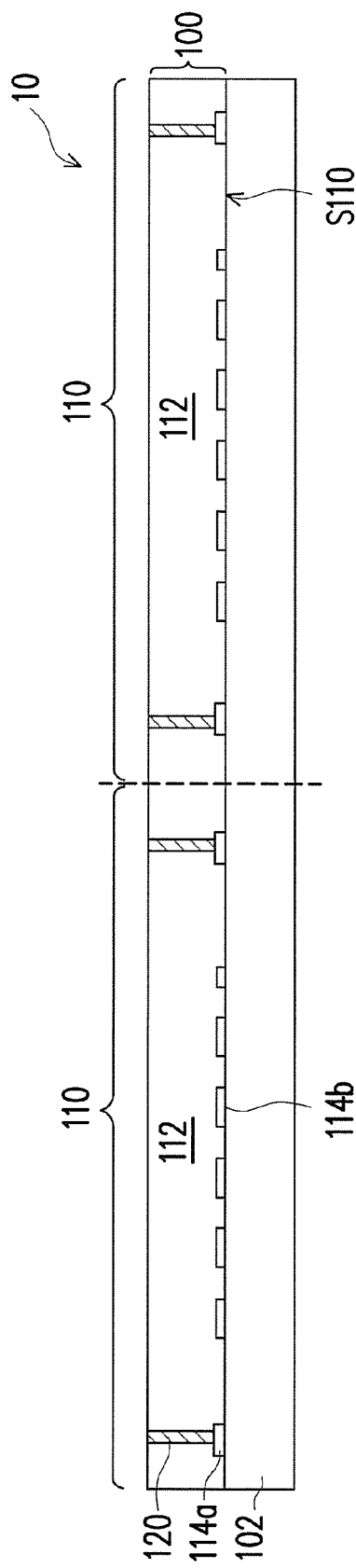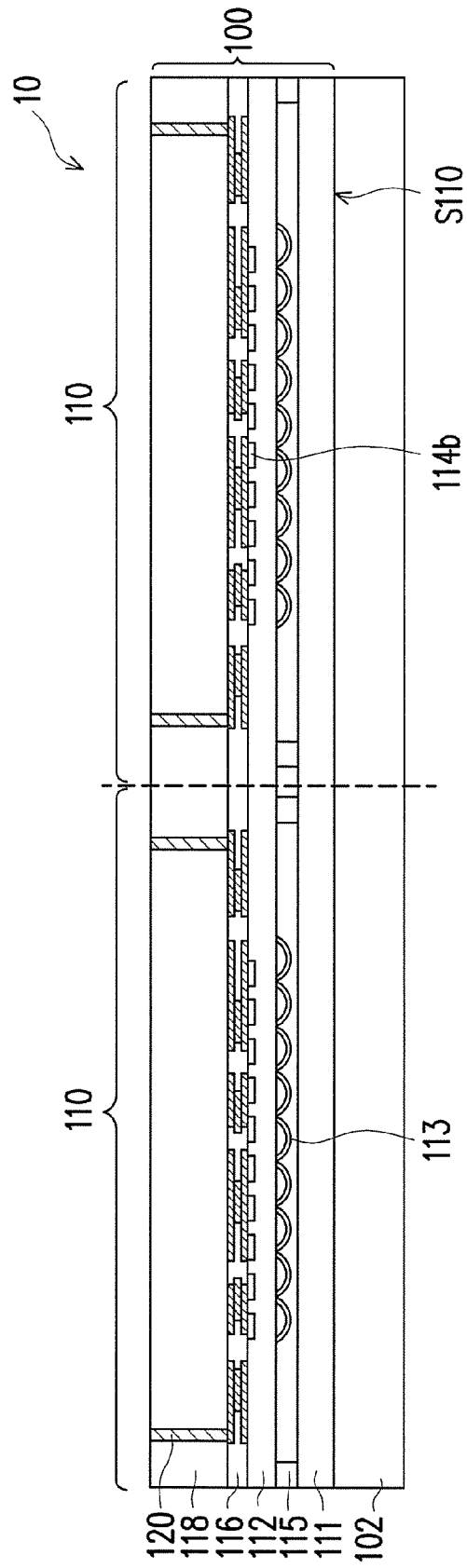
FIG. 1A
FIG. 1A'

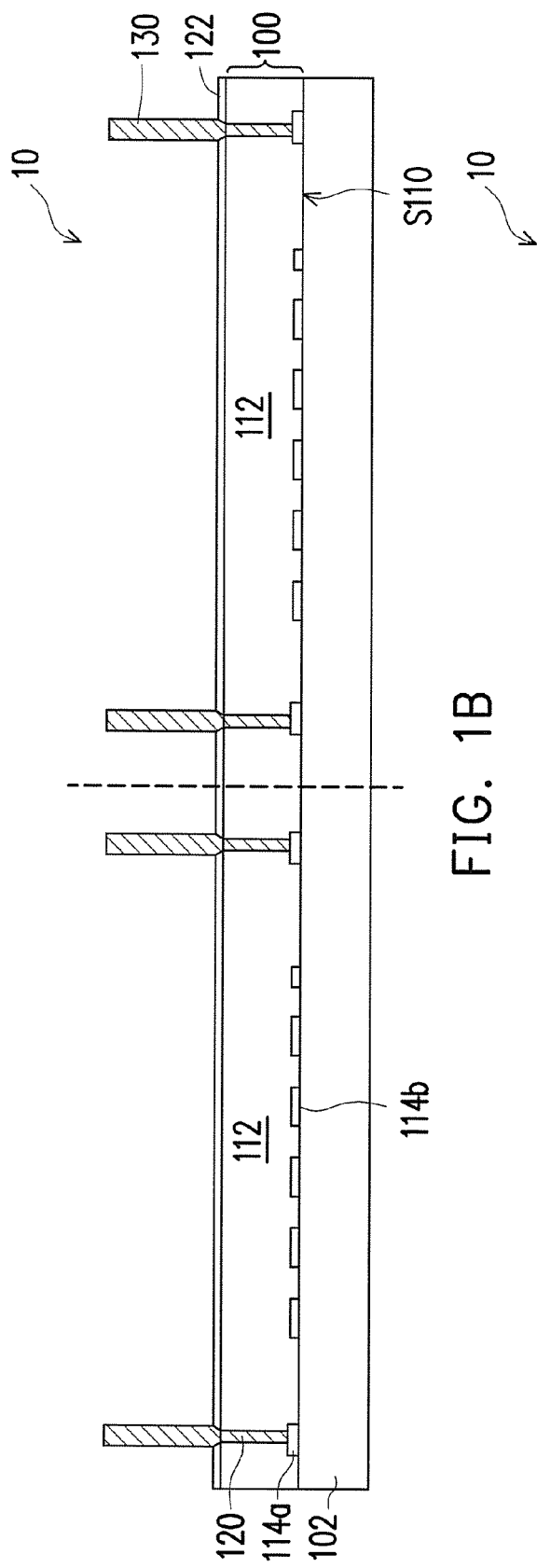
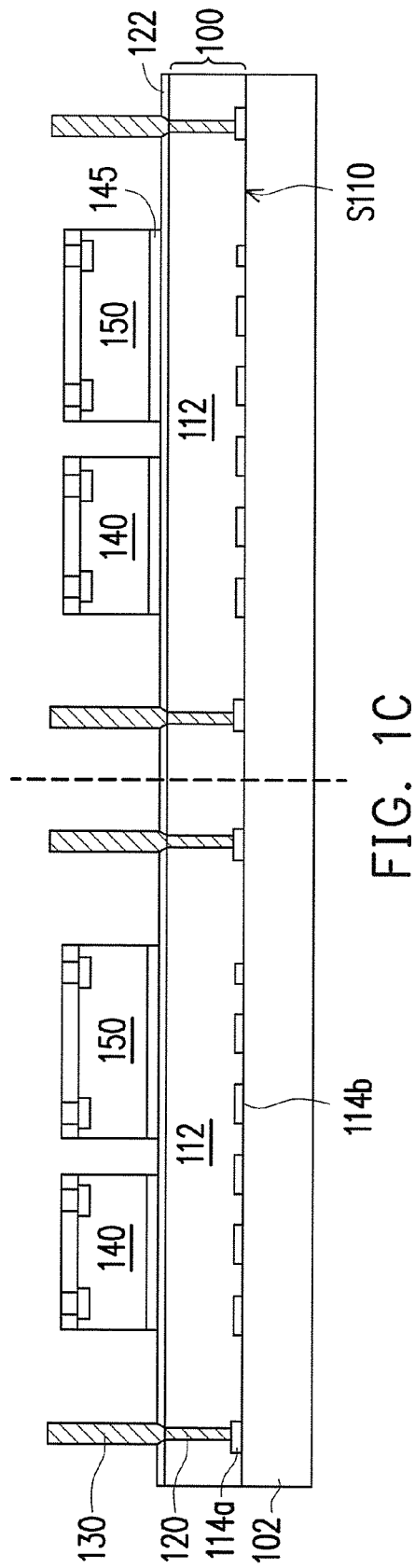
FIG. 1B
FIG. 1C

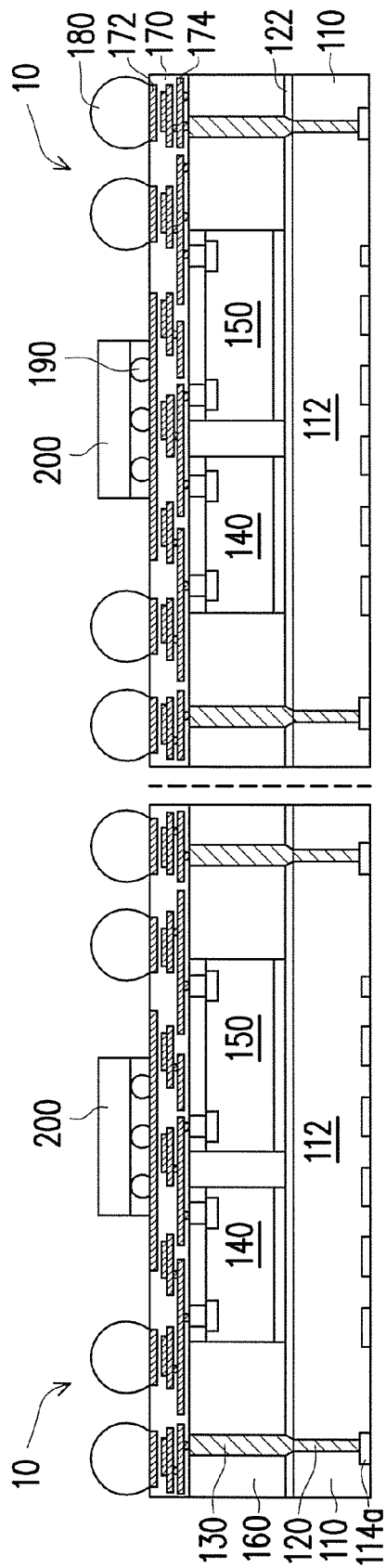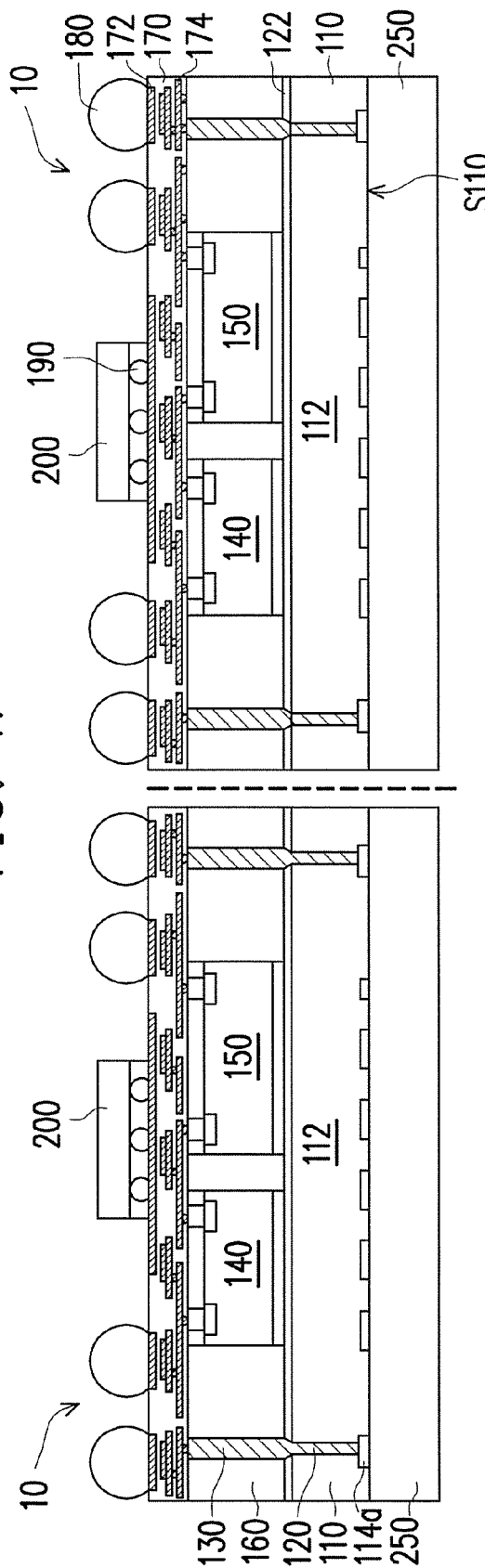
FIG. 1I
FIG. 1J

SEMICONDUCTOR PACKAGE AND MANUFACTURING METHOD THEREOF

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1J are schematic cross sectional views of various stages in a manufacturing method of a semiconductor package according to some exemplary embodiments of the present disclosure.

DETAILED DESCRIPTION

Figure 1D:
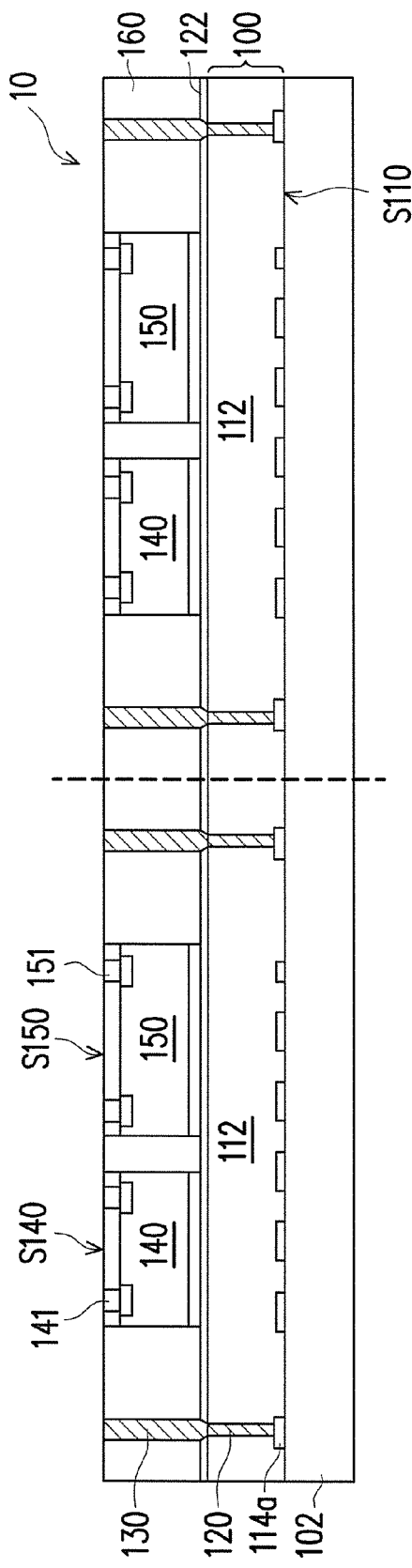

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1A to FIG. 1J are schematic cross sectional views of various stages in a manufacturing method of a semiconductor package according to some exemplary embodiments. In exemplary embodiments, the semiconductor manufacturing method is part of a wafer level packaging process. In some embodiments, two dies are shown to represent plural dies of the wafer, and one or more packages 10 are shown to represent plural semiconductor packages obtained following the semiconductor manufacturing method. Referring to FIG. 1A, in some embodiments, a carrier 102 is provided, the carrier 102 may be a glass carrier or any suitable carrier for the manufacturing method of the semiconductor package. In some embodiments, the carrier 102 is provided with a debond layer (not shown) coated thereon, and the material of the debond layer may be any material suitable for debonding the carrier 102 from the above layers or wafer disposed thereon. Referring to FIG. 1A, in some embodiments, a wafer 100 including first dies 110 is provided and placed on the carrier 102, so that the wafer 100 including the first dies 110 are disposed on and bonded to the carrier 102. In exemplary embodiments, as shown in FIG. 1A, the first die 110 is a sensor chip comprising one or more sensors 112. In certain embodiments, the first die 110 includes at least one fingerprint sensor such as an optical fingerprint sensor or a capacitance fingerprint sensor. In certain embodiments, the first die 110 is provided with through vias 120 formed therein. In one embodiment, the through vias 120 are through silicon vias or through semiconductor vias. In some embodiment, the through vias 120 are connected to contacts or pads 114a of the sensor 112 and are electrically connected to the sensors 112 of the first die 110. In one embodiment, the pads 114a are disposed beside the sensor pattern(s) 114b of the sensor 112, and the sensor pattern(s) 114b refers to the section(s) of the sensor 112 for sensing light or signal. In certain embodiments, the through vias 120 may be formed by laser drilling, mechanical drilling or even photolithographic and etching processes (such as Bosch etching processes) to form via openings penetrating the first die 110 and then filling the openings with a metal material such as copper or copper alloys by electroplating or deposition. In one embodiment, the first die 110 is provided and bonded to the carrier 102 with its front surface S110 facing the carrier 102 (i.e. facing downward in FIG. 1A), and the through vias 120 at the backside of the first die 110 are exposed. In alternative embodiments, the first die 110 includes one or more types of sensors, including charge-coupled devices (CCD), active-pixel sensors (APS) and contact image sensors (CIS). In some embodiments, the first die 110 further includes signal processing circuits, MEMS devices and/or optical devices such as lens, polarizers, spectrometers and the like.

In alternative embodiments, as shown in FIG. 1A', the first die 110 is a sensor chip including one or more CMOS image sensors 112, a conductive bonding structure 116, a signal processing element 118 and through vias 120. In one embodiment, the first die 110 is provided and bonded to the carrier 102 with its front surface S110 facing the carrier 102 (i.e. facing downward in FIG. 1A'), and the through vias 120 at the backside of the first die 110 are exposed. In one embodiment, a lens array 113, a frame structure 115 and a cover layer 111 are further arranged on the sensor(s) 112 of the first die 110 for supporting backside illumination (BSI) mode of the image sensors. In some embodiments, the through vias 120 in the first die 110 are electrically connected to the sensor 112 through the conductive bonding structure 116. In one embodiment, the conductive bonding structure 116 includes a hybrid bonding structure. In one embodiment, the sensors 112 of the first dies 110 include more than one type of sensors used in combination, and different types of sensors for sensing light of different wavelengths.

Referring to FIG. 1B, in some embodiments, a patterned dielectric material layer 122 is formed over the wafer 100 (the first dies 110) but exposing the through vias 120. In certain embodiments, a dielectric material layer (not shown) is formed over the backside of the first dies 110 covering the exposed through vias 120 and then is patterned to form the patterned dielectric material layer 122 exposing the through vias 120. In some embodiments, through interlayer vias (TIVs) 130 are formed on the exposed through vias, and the TIVs 130 are directly connected to the through vias 120. In some embodiments, the TIVs 130 are through integrated fan-out (InFO) vias. In certain embodiments, the locations of the through vias 120 are substantially aligned with (at least partially overlapped with, e.g., in a projective overlapping arrangement from a vertical aspect) the locations of the TIVs 130. In one embodiment, one end of the through via 120 is connected to the pad 114a of the sensor 112, while the other end of the through via 120 is connected to the TIV 130. In some embodiment, the TIVs 130 are aligned with the through vias 120 and are in direct contact with the through vias 120 or at least overlapped with the through vias 120. In some embodiment, as the TIVs 130 are directly connected to the through vias 120, shorter electrical connection path is established for dies located at different levels, thus reducing the height of the package structure 10 and improving electrical performance of the package 10. In some embodiments, the TIVs 130 may be formed by forming a mask pattern (not shown) covering the first dies 110 with openings exposing the through vias 120, forming a metallic material filling the openings to form the TIVs by electroplating or deposition and then removing the mask pattern. In some embodiments, as shown in FIG. 1B, the dotted line represents the cutting line of the wafer 100 and some of the through vias 120 and some of the TIVs 130 are arranged close to but not on the cutting line, and are arranged along the cutting line of the first die 110. In certain embodiments, the through vias 120 are arranged along the periphery of the first die 110 so as to enlarge the sensing region of the first die. However, depending on product design, some of the through vias 120 may be arranged at locations other than the periphery of the first die 110 or arranged between the sensors 112, and the TIVs 130 may be arranged accordingly.

Referring to FIG. 1C, in some embodiments, a second die 140 and a third die 150 are provided and disposed on the patterned dielectric material layer 122 and over the first die 110. In certain embodiment, a die attach film 145 is provided between the second die 140, the third die 150 and the patterned dielectric material layer 122 for better adhering the second die 140, the third die 150 to the patterned dielectric material layer 122. In certain embodiment, as shown in FIG. 1C, the second die 140, the third die 150 and the first die 110 are back-to-back attached. In some embodiments, the second dies 140 and the third dies 150 are placed over the first dies 110 and arranged aside the TIVs 130 (within the area surrounding by the TIVs). In alternative embodiments, some of the TIVs 130 are arranged between the second dies 140 and the third dies 150 depending on product design. In some embodiments, the second die 140 and the third die 150 are different types of dies or the same types of dies and may be selected from application-specific integrated circuit (ASIC) chips, analog chips, sensor chips, wireless and radio frequency chips, voltage regulator chips or memory chips. In some embodiments, the second die 140 is an ASIC chip and the third die 150 is a voltage regulator chip. In certain embodiments, as the through vias 120 are formed within the first die 110, the second die 140 and the third die 150 may be stacked over the first die 110, rather than side-by-side, and the package structure having the dies stacked at different levels has small form factor and better electrical performance. Although two dies are stacked over one first die of the wafer in one exemplary embodiment, the number of the dies stacked over one die of the wafer may be adjusted or modified based on the product design and the types of dies are not limited by the exemplary embodiment.

Referring to FIG. 1D, in some embodiments, the second dies 140, the third dies 150 and the TIVs 130 located over the first dies 110 are molded and encapsulated in a molding compound 160. In one embodiment, the molding compound 160 fills the space between the second and third dies 140, 150 and the TIVs 130, and covers the patterned dielectric material layer 122. In one embodiment, the material of the molding compound 160 includes epoxy resins, phenolic resins or silicon-containing resins.

Referring to FIG. 1D, in some embodiments, the molding compound 160 is planarized to expose topsides of the TIVS 130. In certain embodiments, the molding compound 160 may be planarized to expose the TIVs 130 and the active surface S140 of the second die 140 and the active surface S150 of the third die 150 are exposed. In some embodiment, the over-molded molding compound 160 and the TIVs 130 are polished until the contacts 141, 151 of the second die 140 and the third die 150 are exposed. In one embodiment, after the planarization, the TIVs 130, the molding compound 160, and the second and third dies 140, 150 become substantially levelled (i.e. the top surfaces of these four are coplanar). In some embodiments, the molding compound 160 and the TIVs 130 are planarized through a grinding process or a chemical mechanical polishing (CMP) process.

Figure 1E:
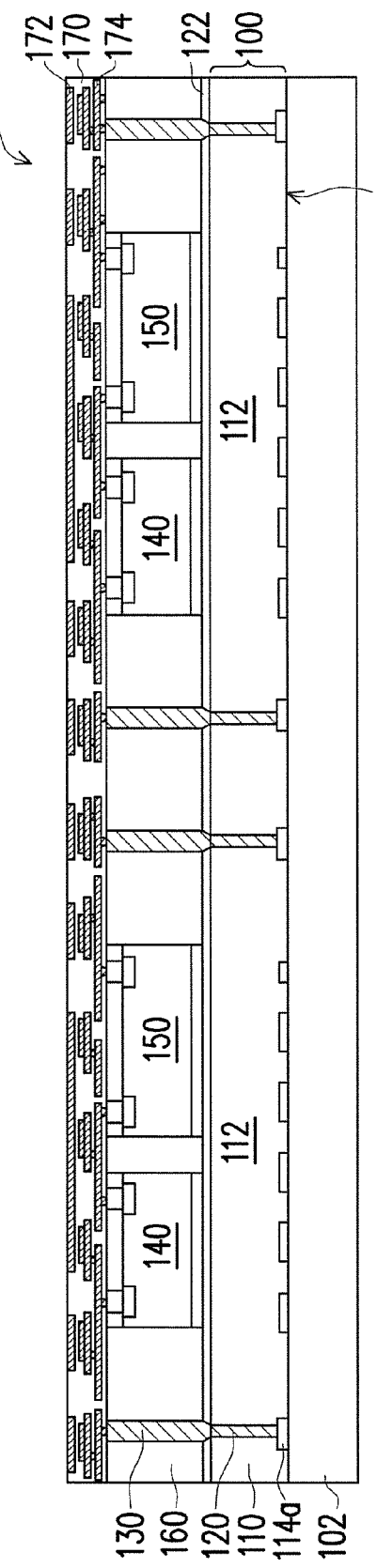

Referring to FIG. 1E, in some embodiments, a first redistribution layer 170 is formed on the molding compound 160, on the second die 140 and the third die 150, and on the TIVs 130. In some embodiment, the first redistribution layer 170 is electrically connected to the TIVs 130 and the second die 140 and the third die 150. The formation of the first redistribution layer 170 includes sequentially forming more than one polymer dielectric material layers and more than one metallization layers in alternation. In certain embodiments, the metallization layers may be sandwiched between the polymer dielectric material layers, but the top surface of the topmost metallization layer 172 is exposed and the lowest metallization layer 174 is connected to the contacts 141, 151 of the second die 140 and the third die 150 and the TIVs 130. In some embodiments, the material of the metallization layers includes aluminum, titanium, copper, nickel, tungsten, and/or alloys thereof. In some embodiments, the material of the polymer dielectric material layers includes polyimide, epoxy resin, acrylic resin, phenol resin, benzocyclobutene (BCB), polybenzooxazole (PBO), or any other suitable polymer-based dielectric material. In some embodiments, the first redistribution layer 170 is electrically connected to the second die 140 and the third die 150 and electrically connected to the first die 110 through the TIVs 130 and the through vias 120.

Figure 1F:
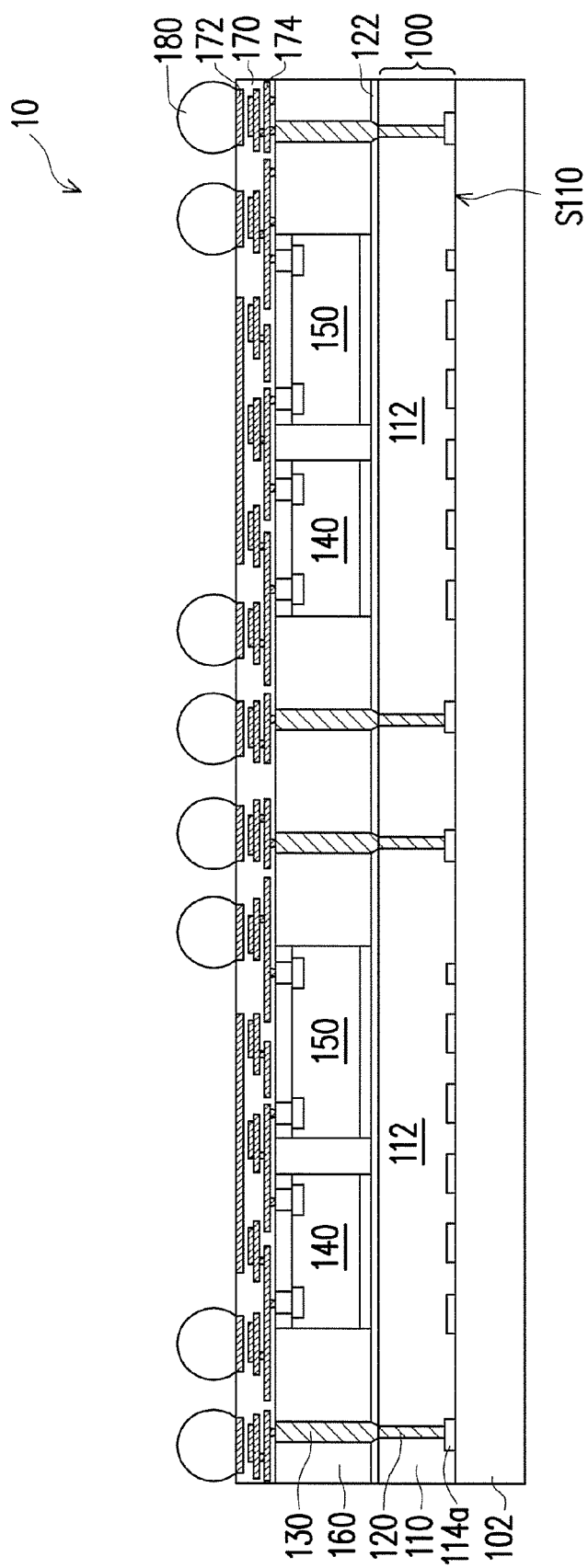

Referring to FIG. 1F, in some embodiments, the conductive elements 180 are disposed on the topmost metallization layer 172 of the first redistribution layer 170. In some embodiments, prior to disposing the conductive elements 180, solder paste (not shown) or flux is applied so that the conductive elements 180 are better fixed to the topmost metallization layer 172, and parts of the topmost metallization layer 172 connected to the conductive elements 180 function as UBM layers or pads for the conductive elements 180. In some embodiments, the conductive elements 180 are, for example, solder balls or ball grid array (BGA) balls placed on the exposed topmost metallization layer 172 of the first redistribution layer 170 and parts of the topmost metallization layer 172 underlying the conductive elements 180 function as UBM layers. In some embodiments, some of the conductive elements 180 are electrically connected to the first die 110 through the first redistribution layer 170, the TIVs 130 and the through vias 120.

Figure 1G:
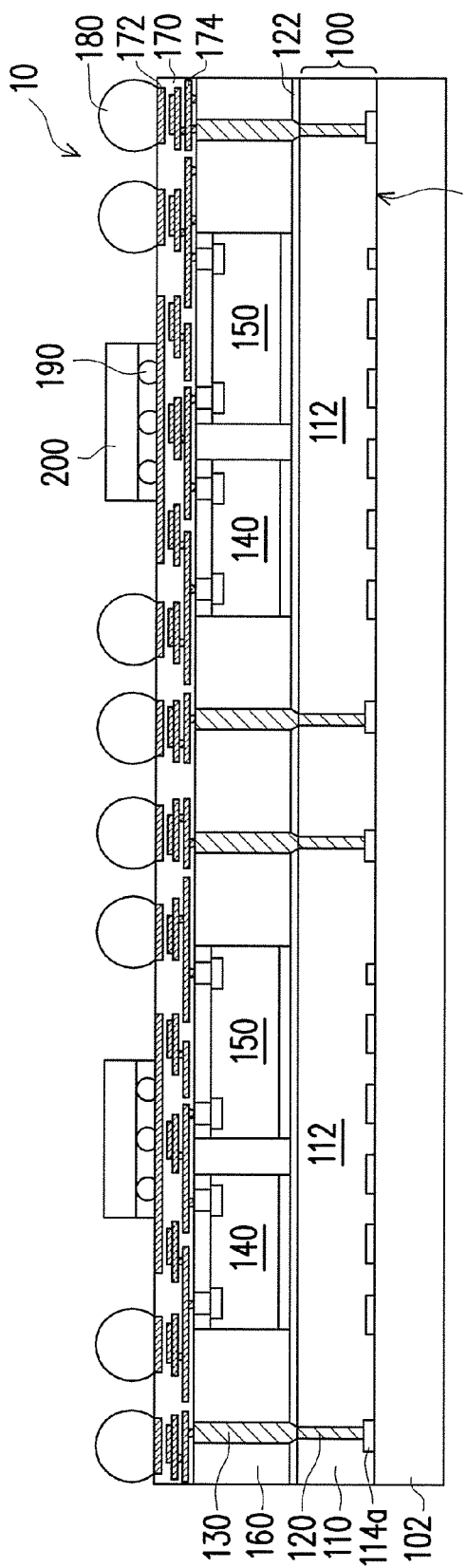

Referring to FIG. 1G, in some embodiments, a fourth die 200 is disposed on the top surface of the first redistribution layer 170. In some embodiments, before disposing the fourth die 200 to the metallization layer 172 of the first redistribution layer 170, the connectors 190 are connected to the fourth die 200 and the fourth die 200 is bonded to the metallization layer 172 of the first redistribution layer 170 through flip chip bonding technology. In some embodiments, prior to disposing the connectors 190, solder paste (not shown) or flux is applied for better fixing. In some embodiments, the connectors 190 are, for example, bumps and parts of the topmost metallization layer 172 underlying the connectors 190 function as bump pads. In some embodiments, the fourth die 200 includes at least one passive component such as capacitors, resistors, inductors, transducers and antennas. In alternative embodiments, the fourth die 200 may be the same type or a different type of die than the second die 140 or the third die 150 and may be selected from application-specific integrated circuit (ASIC) chips, analog chips, sensor chips, wireless and radio frequency chips, voltage regulator chips or memory chips.

In some embodiment, the conductive elements 180 and the fourth die 200 are electrically connected to the first redistribution layer 170, and fourth die 200 may be electrically connected to the second die 140 and the third die 150 through the connectors 190 and the first redistribution layer 170. In some embodiments, the fourth die 200 may be electrically connected to the first die 110 through the connectors 190, the first redistribution layer 170, the TIVs 130 and the through vias 120.

Figure 1H:
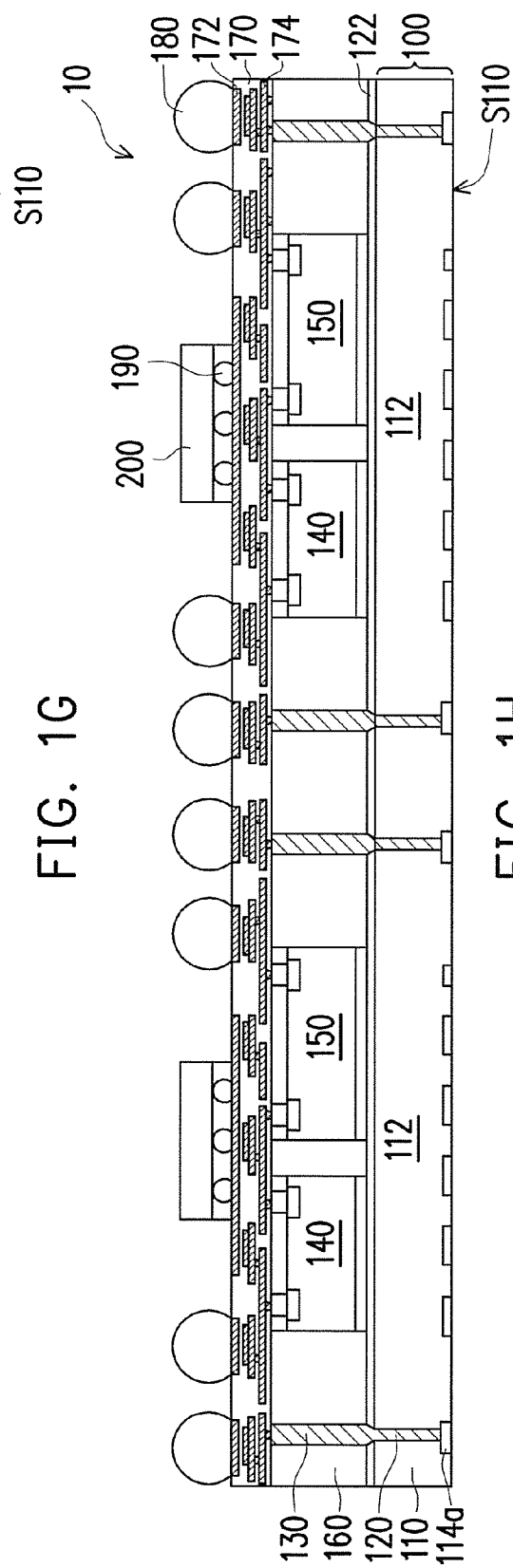

Referring to FIG. 1H, in some embodiments, the carrier 102 is debonded from the first dies 110 of the wafer 100. The wafer 100 is easily separated from the carrier 102 due to the debond layer of the carrier 102. In some embodiments, the wafer 100 is debonded from the carrier 102 and the front surface S110 of the first die 110 is exposed.

Referring to FIG. 1I, in some embodiments, a dicing process is performed to cut the whole package structure (at least cutting though the first redistribution layer 170, the molding compound 160 and the wafer 100) along the cutting line (the dotted line) into individual and separated semiconductor packages 10. In one embodiment, the dicing process is a wafer dicing process including mechanical sawing or laser cutting.

Referring to FIG. 1J, in some embodiments, a protection layer 250 is disposed on the front surface S110 of the first die 110. In some embodiment, the protection layer 250 disposed on the front surface S110 of the first die 110 covers the sensor patterns 114b of the first die 110 and protects the front surface S110 of the first die 110. In some embodiments, the protection layer 250 includes, for example, a glass cover, a cover plate, a hard coating layer, or any other suitable protective films. In some embodiments, the protection layer 250 further includes a functional layer, such as a polarizing film, a color film, an anti-reflection layer or an anti-glare layer. In certain embodiments, the protection layer 250 at least allows specific signal or light at certain wavelengths to pass through. In some embodiments, an adhesive (not shown) is applied onto the front surface S110 or to the protection layer 250, and then the protection layer 250 is disposed and adhered to the first die 110 of the package 10. In alternative embodiment, it is possible to attach the protection layer onto the first dies before performing the dicing process, and such modifications of adjusting the sequence of the process steps or certain optional process are encompassed within the scope of the present disclosure. In exemplary embodiments, the manufacturing method described above is part of a wafer level packaging process, and a plurality of semiconductor packages 10 are obtained after the wafer dicing process. In the subsequent processes, the semiconductor package structure 10 may be flipped (turned upside down) for further processing and mounted onto a circuit board or a system board (not shown) by connecting the conductive elements 180 to the circuit board or system board. In this configuration, the protection layer 250 faces upwards, and the first die 110 is to detect or sense light or signal.

In alternative embodiments, the semiconductor package 10 may further include additional dies disposed over the first die 110 and aside or over the second and third dies 140, 150, and the redistribution layer(s) may be adjusted to electrically connect the additional dies. The structures and/or the processes of the present disclosure are not limited by the exemplary embodiments.

Figure 2A:
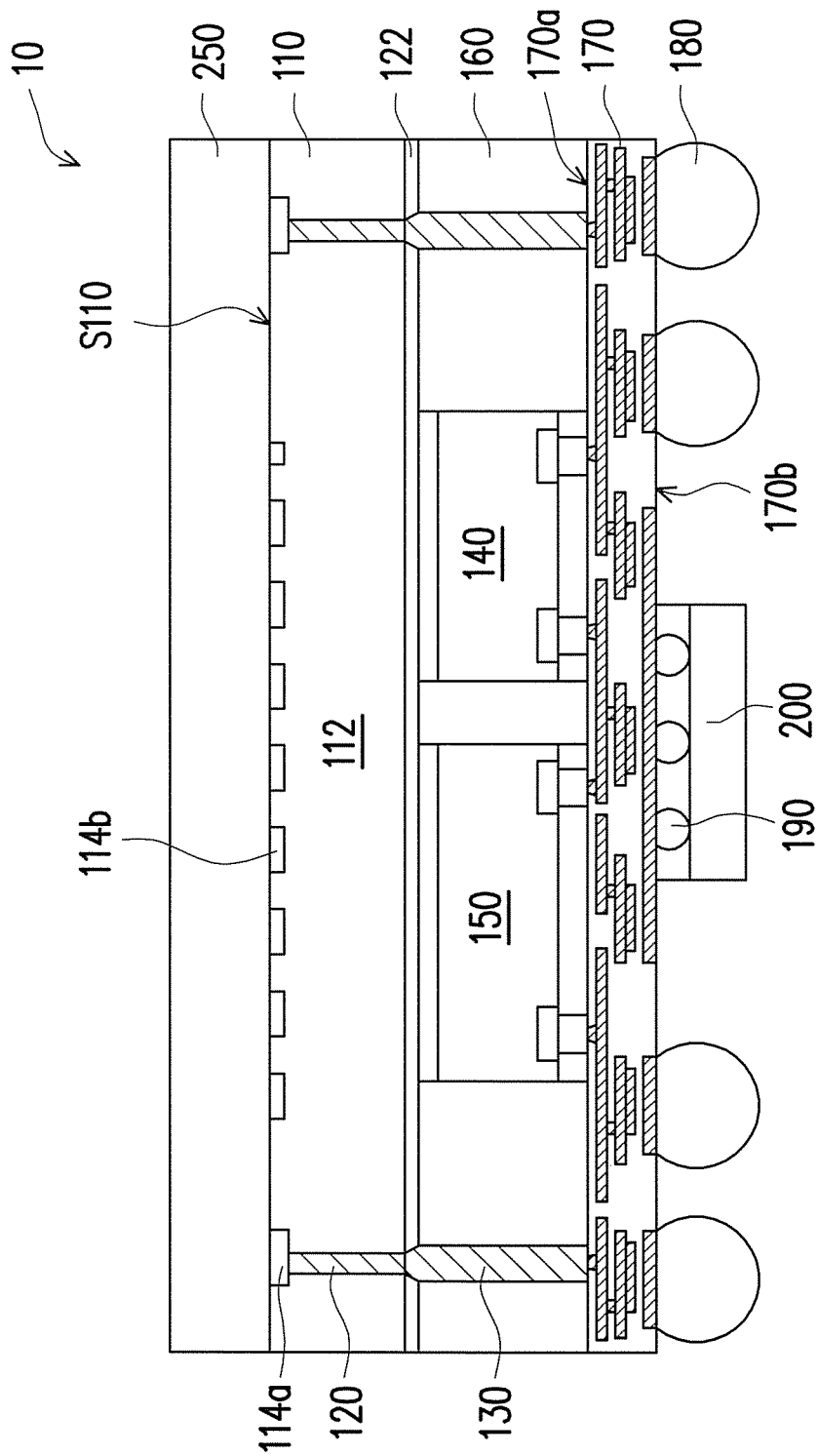
FIG. 2A is a schematic cross sectional view illustrating a semiconductor package according to some exemplary embodiments of the present disclosure.

FIG. 2A is a schematic cross sectional view illustrating a semiconductor package according to some exemplary embodiments. The semiconductor package 10 of FIG. 2A may be fabricated following the previously described manufacturing process as described in FIG. 1A & FIG. 1B-1J. Referring to FIG. 2A, in some embodiments, the semiconductor package 10 includes the protection layer 250, the first die 110, the second die 140, the third die 150, the molding compound 160, the first redistribution layer 170, the fourth die 200, and the conductive elements 180. In some embodiments, the first die 110, the second die 140, the third die 150 and the molding compound 160 are sandwiched between the protection layer 250 and the first redistribution layer 170. In some embodiments, the protection layer 250 covers the front surface S110 of the first die 110. In some embodiments, the second die 140 and the third die 150 are encapsulated within the molding compound 160, and the TIVs 130 penetrating through the molding compound 160 are arranged aside the second die 140 and the third die 150. Except for electrical connection, the TIVs 130 may also function as heat dissipation paths or work as a shielding structure for radio frequency applications.

In exemplary embodiments, as shown in FIG. 2A, the first die 110 is a sensor chip comprising one or more sensors 112. In certain embodiments, the first die 110 includes at least one fingerprint sensor such as an optical fingerprint sensor or a capacitance fingerprint sensor. In certain embodiments, in FIG. 2A, the first die 110 includes one or more through vias 120, and two opposite ends of the through via 120 are respectively connected to the pads 114a of the first die 110 and the TIVs 130. In some embodiments, two opposite ends of the TIVs 130 are respectively connected to the through vias 120 and the first redistribution layer 170. In one embodiment, the through vias 120 are in direct contact with the TIVs 130. In some embodiments, the dielectric material layer 122 is disposed between the first die 110 and the molding compound 160, and the dielectric material layer 122 and the first redistribution layer 170 are located on two opposite sides of the molding compound 160. From the configuration shown in FIG. 2A, in certain embodiment, the second die 140 and the third die 150 are disposed on the upper surface 170a of the first redistribution layer 170 and the contacts 141, 154 of the second die 140 and the third die 150 are connected to the first redistribution layer 170, while the conductive elements 180 are disposed on the lower surface 170b of the first redistribution layer 170 and connected to the first redistribution layer 170. In certain embodiments, the fourth die 200 is connected to the first redistribution layer 170 through the connectors 190 disposed on the lower surface of the first redistribution layer 170.

In some embodiments, the second die 140 and the third die 150 are different types of dies or the same types of dies and may be selected from application-specific integrated circuit (ASIC) chips, analog chips, sensor chips, wireless and radio frequency chips, voltage regulator chips or memory chips. In some embodiments, the second die 140 is an ASIC chip and the third die 150 is a voltage regulator chip. In some embodiments, the fourth die 200 includes at least one passive component such as capacitors, resistors, inductors, transducers and antennas. In certain embodiment, the protection layer 250 allows light at certain wavelengths (visible light, infrared or UV light or light of various colors) or a specific signal to pass through. In some embodiments, the protection layer 250 includes, for example, a glass cover, a cover plate, a hard coating layer, or any other suitable protective films. In some embodiments, the protection layer 250 further includes a functional layer, such as a polarizing film, a color film, an anti-reflection layer or an anti-glare layer.

Figure 2B:
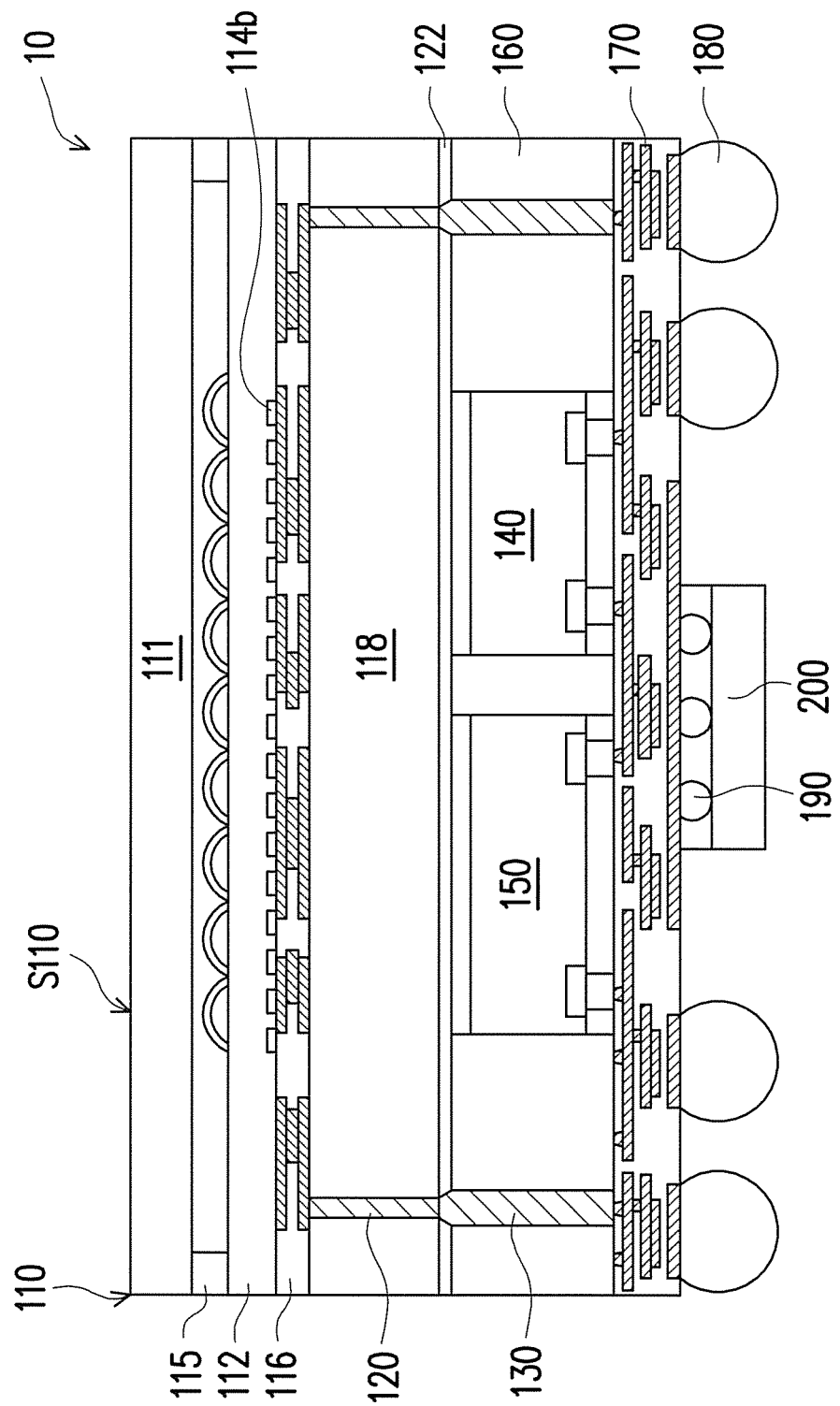
FIG. 2B is a schematic cross sectional view illustrating a semiconductor package according to some exemplary embodiments of the present disclosure.

FIG. 2B is a schematic cross sectional view illustrating a semiconductor package according to some exemplary embodiments. The semiconductor package 10 of FIG. 2B may be fabricated following the previously described manufacturing process as described in FIG. 1A' & FIG. 1B-1I, rather than the process as shown in FIG. 1A. Referring to FIG. 2B, in some embodiments, similar to the semiconductor package 10 of FIG. 2A, the package 10 in FIG. 2B includes the first die 110, the second die 140, the third die 150, the molding compound 160, the first redistribution layer 170, the fourth die 200, and the conductive elements 180. In FIG. 2B, the first die 110 is a sensor chip including at least one CMOS image sensor 112, the conductive bonding structure 116, the signal processing element 118 and the through vias 120. In some embodiments, the lens array 113 is located above the sensor pattern(s) 114b of the sensor 112. In one embodiment, the first die 110 is disposed on the dielectric material layer 122 with its front surface S110 facing away from the molding compound 160 (i.e. facing upward in FIG. 2B), and the through vias 120 of the first die 110 are connected to the TIVs 130. In some embodiments, the through vias 120 in the first die 110 are electrically connected to the sensor 112 through the conductive bonding structure 116. In one embodiment, the sensor 112 and the signal processing element 118 are electrically connected through the conductive bonding structure 116 and the first die 110 is electrically connected to the first redistribution layer 170 through the conductive bonding structure 116, the through vias 120 and the TIVs 130. In one embodiment, the conductive bonding structure 116 includes a hybrid bonding structure.

In certain embodiments, in FIG. 2B, two opposite ends of the through via 120 of the first die 110 are respectively connected to the conductive bonding structure 116 of the first die 110 and the TIVs 130. In some embodiments, two opposite ends of the TIVs 130 are respectively connected to the through vias 120 and the first redistribution layer 170. In one embodiment, the through vias 120 are in direct contact with the TIVs 130. The elements similar to or substantially the same as the elements described in FIG. 2A will use the same reference numbers, and certain details or descriptions of the same elements will not be repeated herein.

Figure 3A:
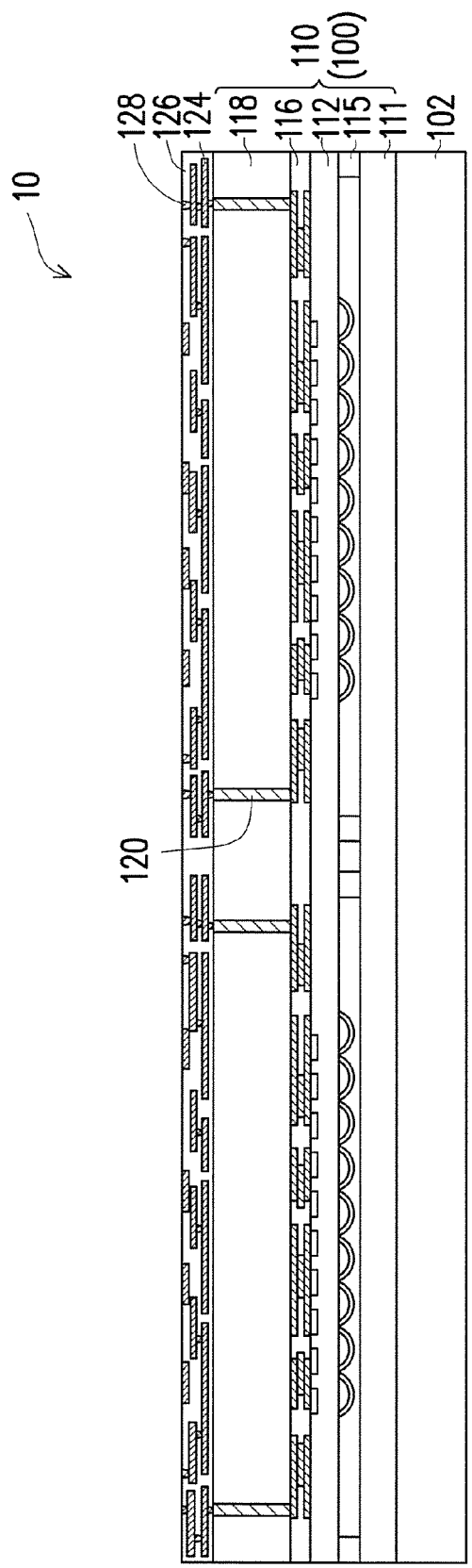
FIG. 3A to FIG. 3I are schematic cross sectional views of various stages in a manufacturing method of a semiconductor package according to some exemplary embodiments of the present disclosure.

FIG. 3A to FIG. 3I are schematic cross sectional views of various stages in a manufacturing method of a semiconductor package according to some alternative exemplary embodiments of the present disclosure. In alternative embodiments, as shown in FIG. 3A, a second redistribution layer 126 is formed on the first dies 110 of the wafer 100 bonded onto the carrier 102, following the process as described in FIG. 1A'. The elements similar to or substantially the same as the elements described in FIG. 1A' will use the same reference numbers, and certain details or descriptions of the same elements will not be repeated herein. The second redistribution layer 126 covers the signal processing element 118 and through vias 120 of the first die 110 and is connected to the signal processing element 118 and through vias 120 of the first die 110. In some embodiments, the second redistribution layer 126 is electrically connected to the sensors 112 and the signal processing elements 118 of the first dies 110 by way of the through vias 120 and the conductive bonding structures 116 of the first dies 110. The formation of the second redistribution layer 126 includes sequentially forming the more than one polymer dielectric material layers and more than one metallization layers in alternation. In certain embodiments, the metallization layers may be sandwiched between the polymer dielectric material layers, but the top surface of the topmost metallization layer 128 is exposed and the lowest metallization layer 124 is connected to the through vias 120 of the first die 110. The redistribution layer may have similar layered-up configurations as described in the previous embodiments, and similar materials of the metallization layers and/or the polymer dielectric material layers will be used and will not be repeated herein.

Figure 3B:
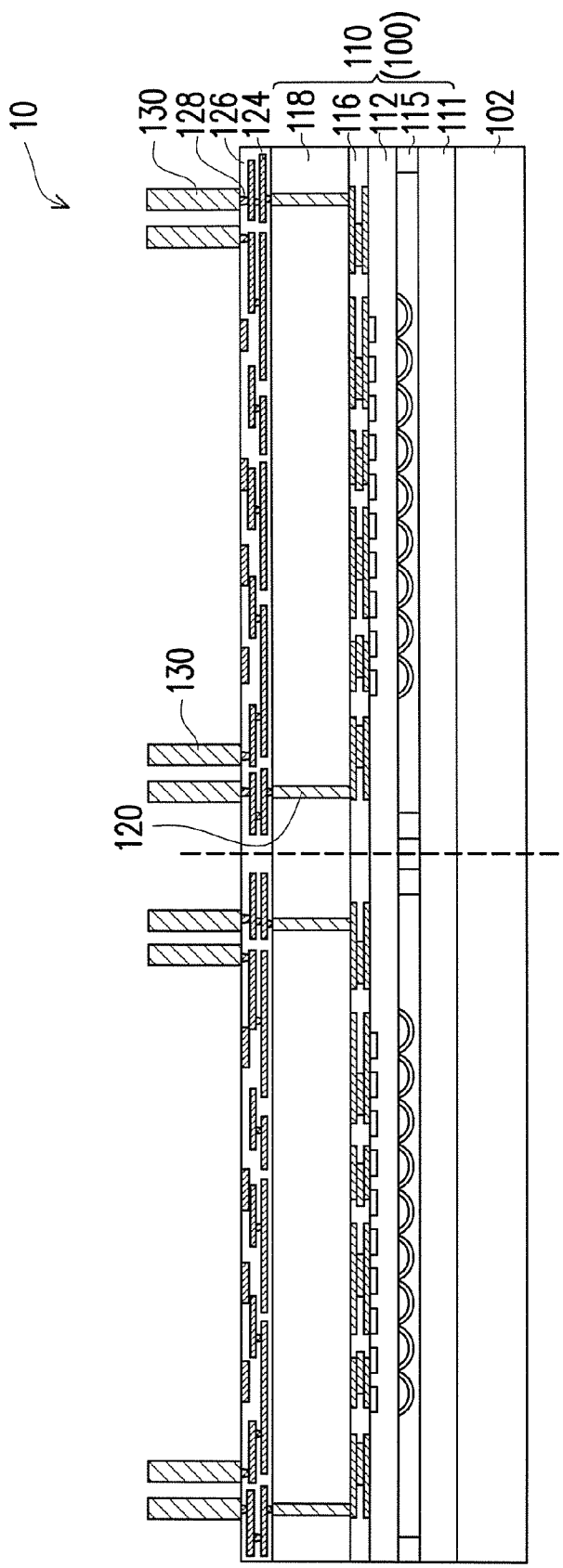

In some embodiments, as shown in FIG. 3B, the through interlayer vias (TIVs) 130 are formed on the second redistribution layer 126 and are connected to the exposed topmost metallization layer 128 of the second redistribution layer 126. The through vias 120 are electrically connected to the TIVs 130 through the second redistribution layer 126, which offers more flexibility in the layout design of the TIVs 130 and/or the through vias 120. In one embodiment, one end of the through via 120 is connected to part of the conductive bonding structure 116, while the other end of the through via 120 is connected to the lowest metallization layer 124 of the second redistribution layer 126. In some embodiments, the TIVs 130 may be formed by forming a mask pattern (not shown) covering the second redistribution layer 126 with openings exposing the second redistribution layer 126, forming a metallic material filling the openings to form the TIVs by electroplating or deposition and then removing the mask pattern. In some embodiments, as shown in FIG. 3B, the dotted line represents the cutting line of the wafer 100 and the through vias 120 and the TIVs 130 are arranged close to but not on the cutting line, and are arranged adjacent to the periphery of the first die 110.

Figure 3C:
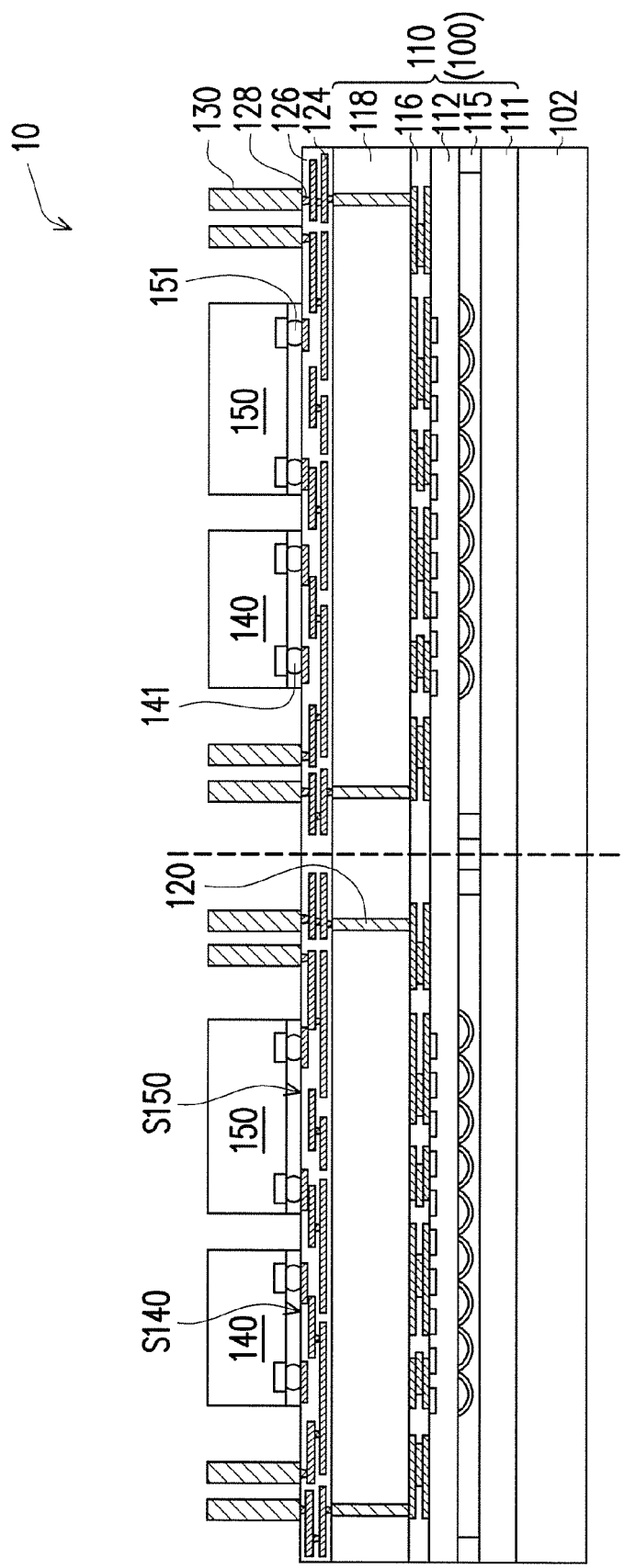

Referring to FIG. 3C, in some embodiments, the second die 140 and the third die 150 are provided and disposed on the second redistribution layer 126 and over the first dies 110. In certain embodiment, the second die 140 and the third die 150 are bonded to the second redistribution layer 126 and the active surface S140 of the second die 140 and the active surface S150 of the third die 150 faces and are connected to the second redistribution layer 126. In some embodiment, the contacts 141, 151 of the second die 140 and the third die 150 are connected to the exposed topmost metallization layer 128 of the second redistribution layer 126, via flip chip bonding technology. In certain embodiment, as shown in FIG. 3C, the front sides of the second die 140 and the third die 150 are attached to the back side of the first die 110 in a front-to-back style. In some embodiments, the second dies 140 and the third dies 150 are placed over the first dies 110 and located aside the TIVs 130. In some embodiments, some of the TIVs 130 are arranged between the second dies 140 and the third dies 150 or surrounding the second dies 140 and the third dies 150 depending on product design. In some embodiments, the second die 140 and the third die 150 are different types of dies or the same types of dies and may be selected from ASIC chips, analog chips, sensor chips, wireless and radio frequency chips, voltage regulator chips or memory chips. In some embodiments, the second die 140 is a radio frequency chip and the third die 150 is a memory chip. The number and/or the types of the dies stacked over the wafer may be adjusted or modified based on the product design. In some embodiment, the second die 140 and the third die 150 may be electrically connected to the first die 110 through the second redistribution layer 126 and the through vias 120. As the through vias 120 are formed within the first die 110, the second die 140 and the third die 150 may be stacked over the first die 110, rather than side-by-side, and the package structure having the dies stacked at different levels has small form factor and better electrical performance.

Figure 3D:
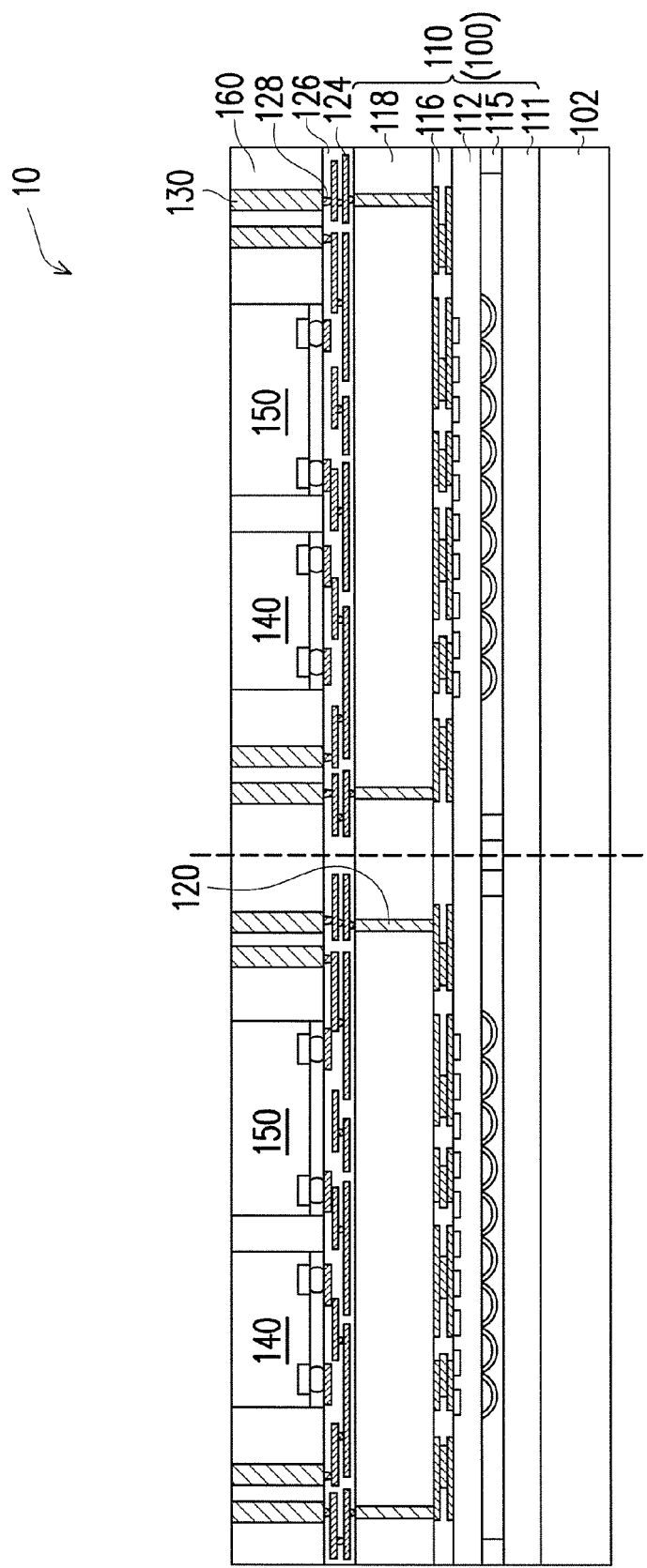

Referring to FIG. 3D, in some embodiments, the second dies 140, the third dies 150 and the TIVs 130 located over the first dies 110 are molded and encapsulated in the molding compound 160. In FIG. 3D, in some embodiments, the molding compound 160 is planarized until topsides of TIVs 130 are exposed. In certain embodiments, the molding compound 160 is optionally planarized to expose the TIVs 130 and the backsides of the second die 140 and the third die 150.

Figure 3E:
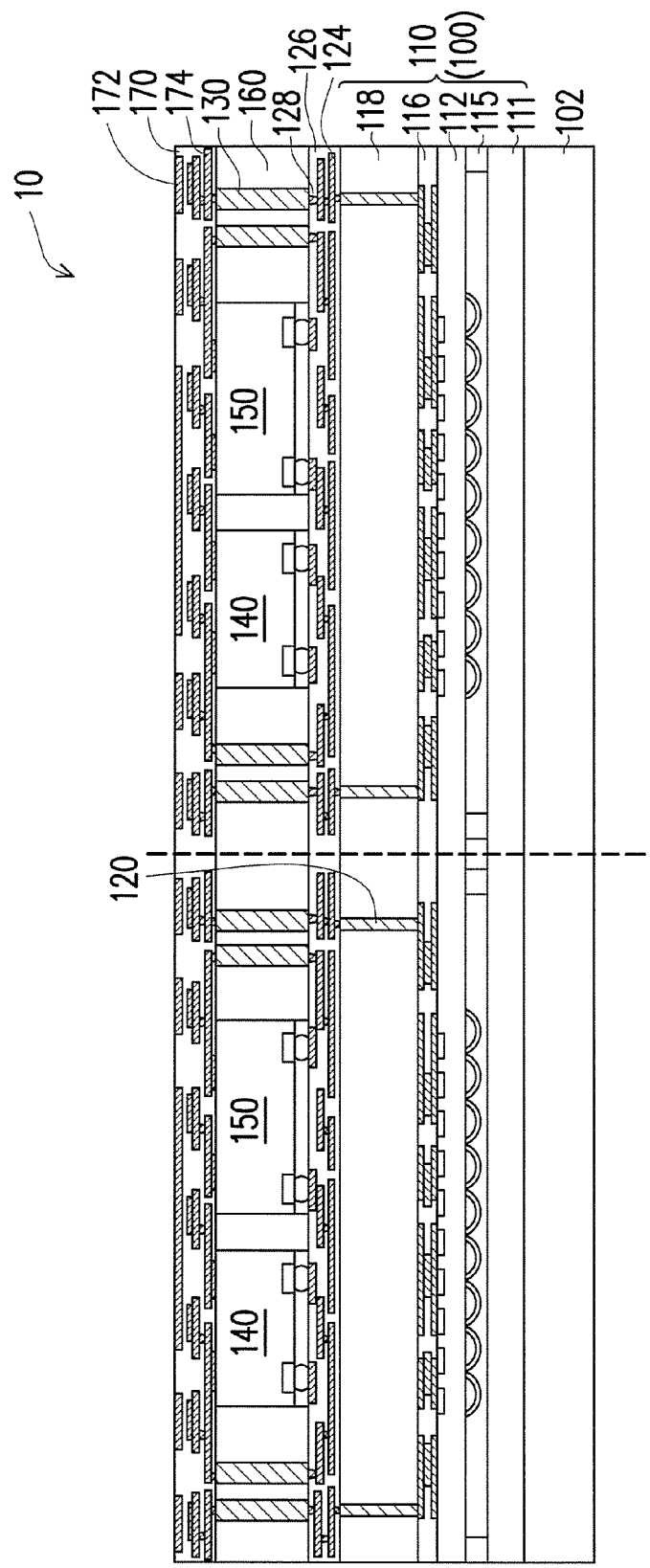

Referring to FIG. 3E, in some embodiments, the first redistribution layer 170 is formed on the molding compound 160 and on the TIVs 130. In some embodiment, the first redistribution layer 170 is electrically connected to the TIVs 130 and may be electrically connected to the second die 140 and the third die 150. The formation and the materials of the first redistribution layer 170 have been described in details as above and will not be repeated herein. In certain embodiments, the top surface of the topmost metallization layer 172 of the first redistribution layer 170 is exposed and the lowest metallization layer 174 is connected to the TIVs 130. In some embodiments, the first redistribution layer 170 may be electrically connected to the second die 140 and/or the third die 150 through the TIVs 130 and the second redistribution layer 126 and are electrically connected to the first die 110 through the TIVs 130, the second redistribution layer 126 and the through vias 120.

Figure 3F:
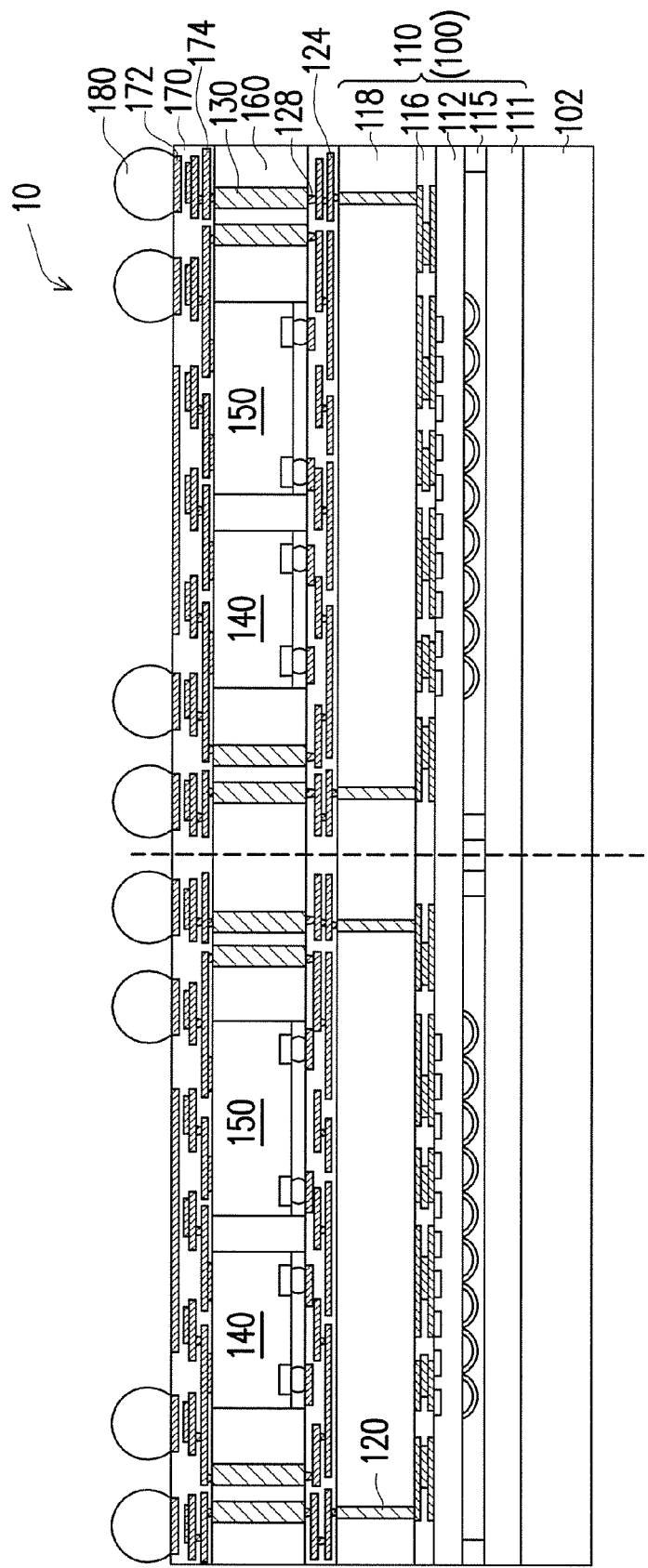

Referring to FIG. 3F, in some embodiments, the conductive elements 180 are disposed on the topmost metallization layer 172 of the first redistribution layer 170. In some embodiments, prior to disposing the conductive elements 180, solder paste (not shown) or flux is applied so that the conductive elements 180 are better fixed to the topmost metallization layer 172, and parts of the topmost metallization layer 172 connected to the conductive elements 180 function as UBM or pads for the conductive elements 180. In some embodiments, the conductive elements 180 are, for example, solder balls or ball grid array (BGA) balls placed on the exposed topmost metallization layer 172 of the first redistribution layer 170 and parts of the topmost metallization layer 172 underlying the conductive elements 180 function as UBM layers. In some embodiments, some of the conductive elements 180 are electrically connected to the first die 110 through the first redistribution layer 170, the TIVs 130, the second redistribution layer 126 and the through vias 120.

Figure 3G:
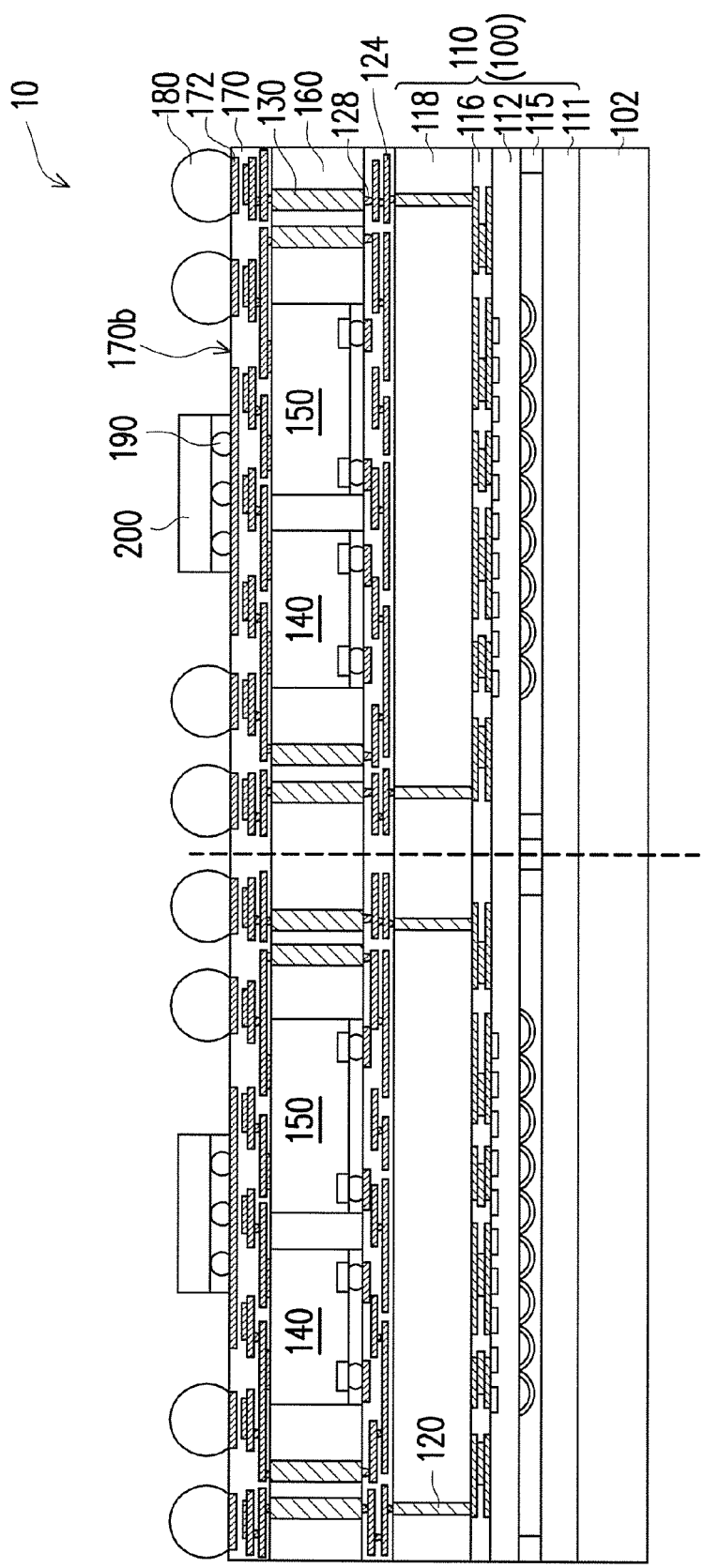

Referring to FIG. 3G, in some embodiments, the fourth die 200 is disposed onto the surface 170b of the first redistribution layer 170. In some embodiments, before disposing the fourth die 200 to the topmost metallization layer 172 of the first redistribution layer 170, the connectors 190 are connected to the fourth die 200 and the fourth die 200 is bonded to the topmost metallization layer 172 of the first redistribution layer 170 through flip chip bonding technology. In some embodiments, prior to disposing the connectors 190, solder paste (not shown) or flux is applied for better fixing. In some embodiments, the connectors 190 are, for example, bumps and parts of the topmost metallization layer 172 underlying the connectors 190 function as bump pads. In some embodiments, the fourth die 200 includes at least one passive component such as capacitors, resistors, inductors, transducers and antennas. In alternative embodiments, the fourth die 200 may be the same type or a different type of the die than the second die 140 or the third die 150 and may be selected from ASIC chips, analog chips, sensor chips, wireless and radio frequency chips, voltage regulator chips or memory chips.

In some embodiment, the fourth die 200 may be electrically connected to the second die 140 and/or the third die 150 through the connectors 190, the first and second redistribution layers 170, 126 and the TIVs 130. In some embodiments, the fourth die 200 may be electrically connected to the first die 110 through the connectors 190, the first and second redistribution layers 170, 126, the TIVs 130 and the through vias 120.

Figure 3H:
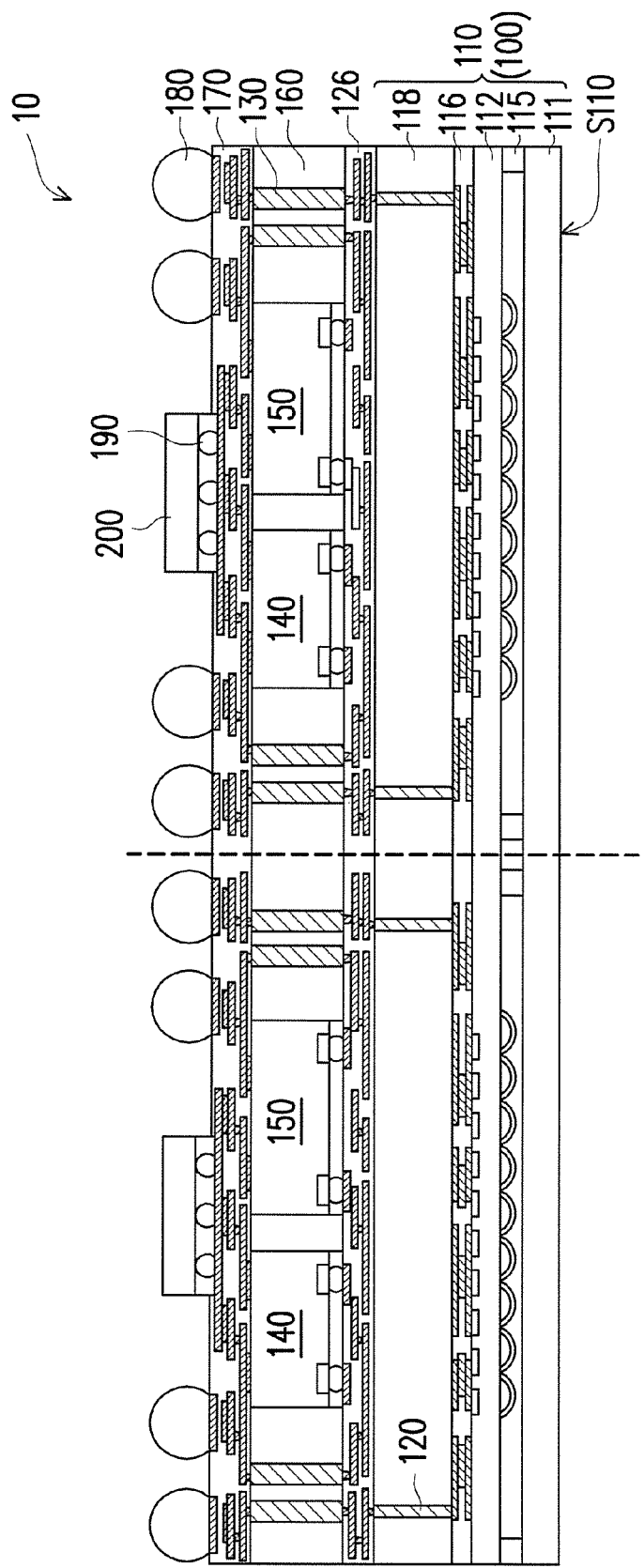

Referring to FIG. 3H, in some embodiments, the carrier 102 is debonded from the wafer 100. In some embodiments, the wafer 100 is debonded from the carrier 102 and the front surface S110 (the cover layer 111) of the first die 110 is exposed.

Figure 3I:
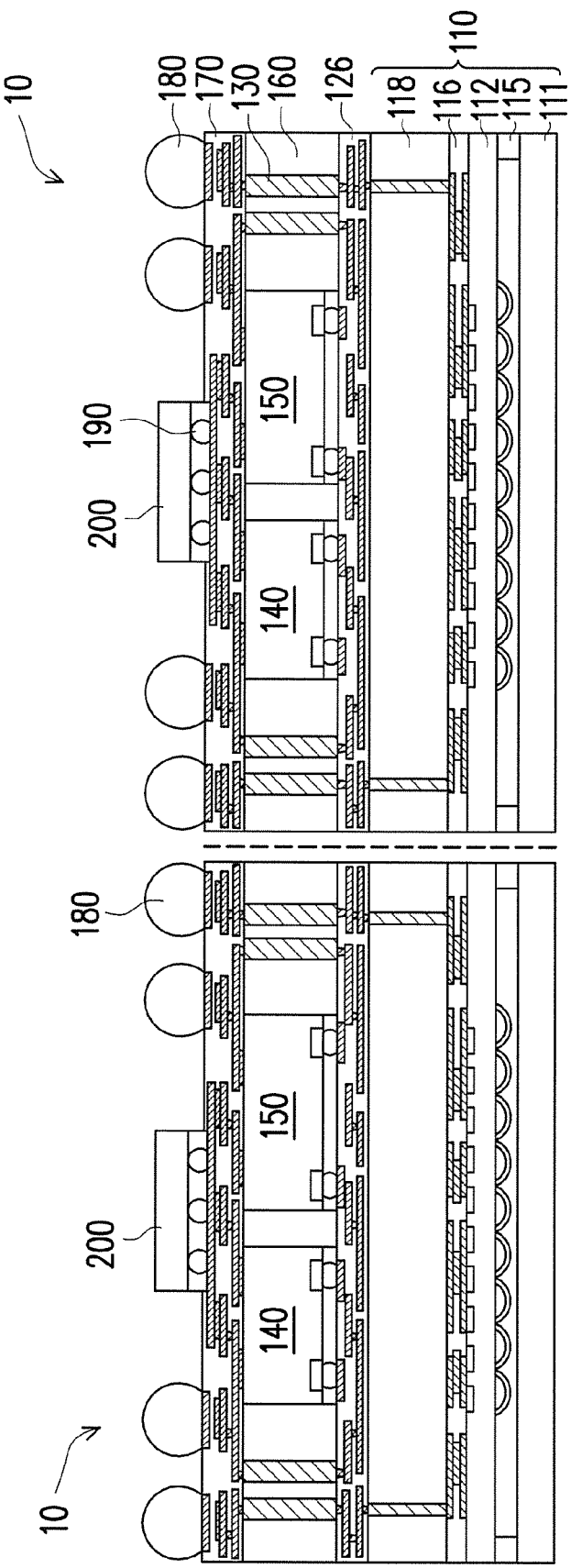

Referring to FIG. 3I, in some embodiments, a dicing process is performed to cut the whole package structure (at least cutting though the first redistribution layer 170, the molding compound 160, the second redistribution layer 126 and the wafer 100) along the cutting line (the dotted line) into individual and separated semiconductor packages 10.

Figure 4A:
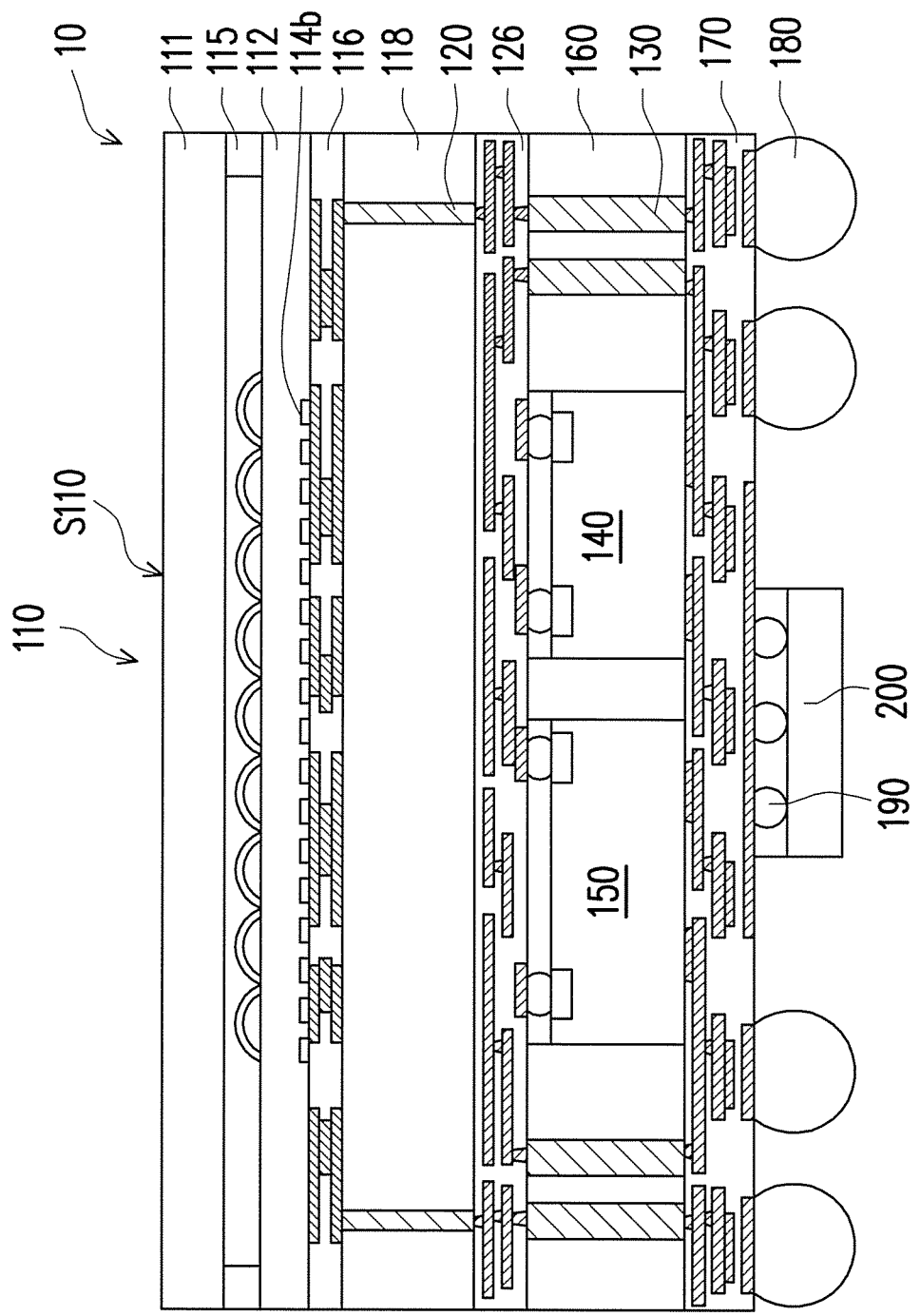
FIG. 4A is a schematic cross sectional view illustrating a semiconductor package according to some exemplary embodiments of the present disclosure.

FIG. 4A is a schematic cross sectional view illustrating a semiconductor package according to some exemplary embodiments. The semiconductor package 10 of FIG. 4A may be fabricated following the previously described manufacturing process as described in FIG. 1A' & FIG. 3A-3I. Referring to FIG. 4A, in some embodiments, the semiconductor package 10 includes the first die 110, the second redistribution layer 126, the second die 140, the third die 150, the molding compound 160, the first redistribution layer 170, the fourth die 200, and the conductive elements 180. In some embodiments, the first die 110 is disposed on the second redistribution layer 126, and the second die 140, the third die 150 and the molding compound 160 are sandwiched between the second redistribution layer 126 and the first redistribution layer 170. In some embodiments, in the configuration of FIG. 4A, the first die 110 is a sensor chip including at least one CMOS image sensor 112, the conductive bonding structure 116, the signal processing element 118 and the through vias 120. In one embodiment, the first die 110 is disposed on the second redistribution layer 126 with its front surface S110 facing away from the molding compound 160 (i.e. facing upward in FIG. 4A), and the through vias 120 of the first die 110 are connected to the second redistribution layer 126. In some embodiments, the through vias 120 in the first die 110 are electrically connected to the sensor 112 through the conductive bonding structure 116. In one embodiment, the first die 110 may be electrically connected to the first redistribution layer 170, the conductive elements 180 or the fourth die 200 through the conductive bonding structure 116, the through vias 120, the second redistribution layer 126 and the TIVs 130. In some embodiments, the second die 140 and the third die 150 are encapsulated within the molding compound 160, and the TIVs 130 penetrating through the molding compound 160 are arranged aside and around the second die 140 and the third die 150.

Figure 4B:
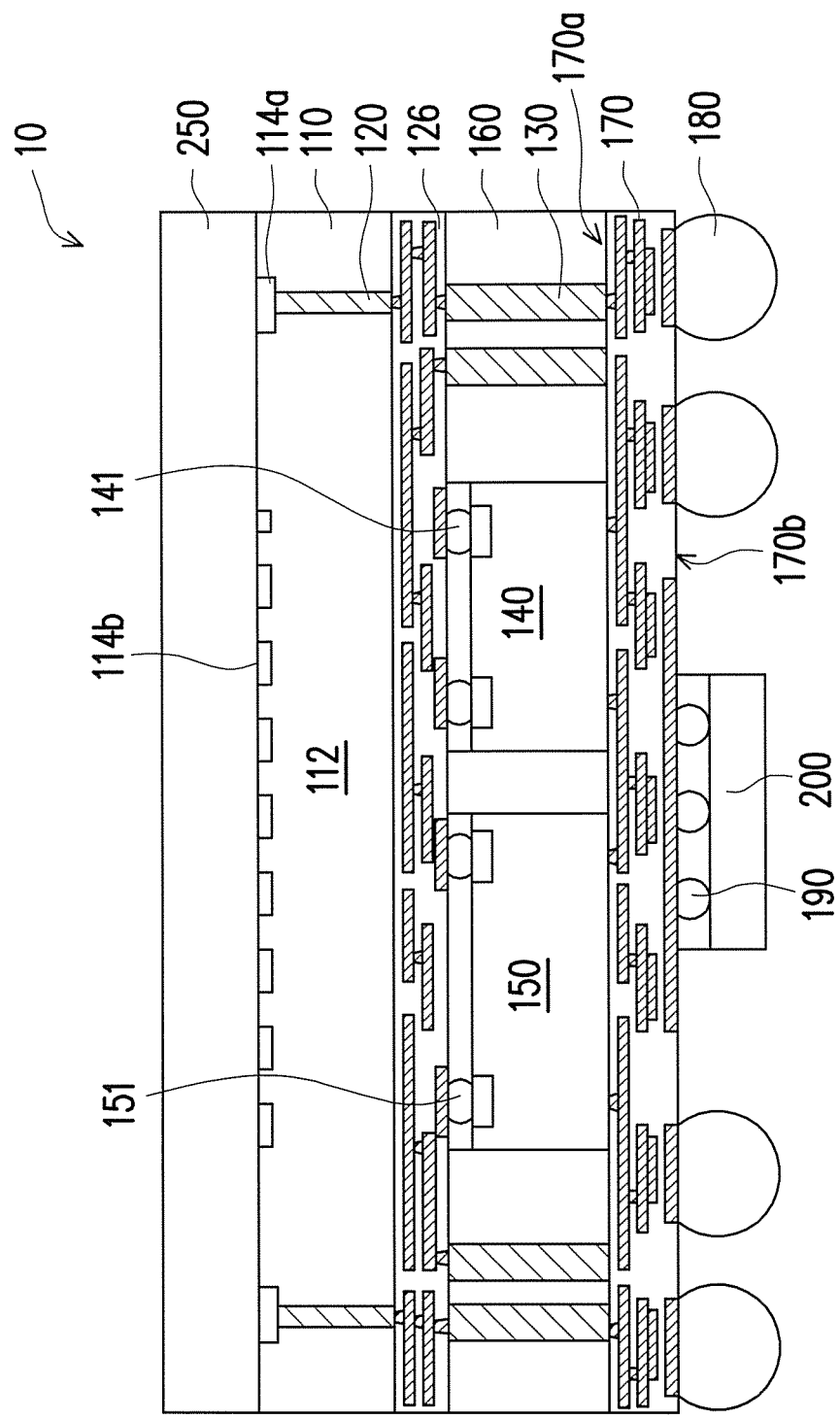
FIG. 4B is a schematic cross sectional view illustrating a semiconductor package according to some exemplary embodiments of the present disclosure.

FIG. 4B is a schematic cross sectional view illustrating a semiconductor package according to some exemplary embodiments. The semiconductor package 10 of FIG. 4B may be fabricated following the previously described manufacturing process as described in FIG. 1A, FIG. 3A-3I and FIG. 1J. Referring to FIG. 4B, in some embodiments, the semiconductor package 10 includes the protection layer 250, the first die 110, the second redistribution layer 126, the second die 140, the third die 150, the molding compound 160, the first redistribution layer 170, the fourth die 200, and the conductive elements 180. In some embodiments, the first die 110 is disposed on the second redistribution layer 126, and the second die 140, the third die 150 and the molding compound 160 are sandwiched between the second redistribution layer 126 and the first redistribution layer 170. In some embodiments, in the configuration of FIG. 4B, the first die 110 is a sensor chip comprising one or more sensors 112. In certain embodiments, the first die 110 includes at least one fingerprint sensor such as an optical fingerprint sensor or a capacitance fingerprint sensor. In certain embodiments, in FIG. 4B, the two opposite ends of the through via 120 are respectively connected to the pads 114a of the first die 110 and the second redistribution layer 126. In some embodiments, two opposite ends of the TIVs 130 are respectively connected to the second redistribution layer 126 and the first redistribution layer 170. In some embodiments, the second redistribution layer 126 is disposed between the first die 110 and the molding compound 160, and the second redistribution layer 126 and the first redistribution layer 170 are located on two opposite sides of the molding compound 160. From the configuration shown in FIG. 4B, in certain embodiment, the second die 140 and the third die 150 are disposed on the upper surface 170a of the first redistribution layer 170 and the contacts 141, 151 of the second die 140 and the third die 150 are connected to the second redistribution layer 126, while the conductive elements 180 are disposed on the lower surface 170b of the first redistribution layer 170 and connected to the first redistribution layer 170. In certain embodiments, the fourth die 200 is connected to the first redistribution layer 170 through the connectors 190 disposed on the lower surface 170b of the first redistribution layer 170.

According to some embodiments, a semiconductor package has a first redistribution layer, a first die, at least one second die, at least one third die, a molding compound, through interlayer vias, conductive elements and at least one fourth die. The first die is disposed over the first redistribution layer and has at least one through via. The first die comprises at least one sensor. The second die and the third die are disposed on the first redistribution layer and between the first redistribution layer and the first die. The molding compound is disposed on the first redistribution layer and between the first redistribution layer and the first die, and the molding compound encapsulates the second die and the third die. The through interlayer vias arranged through the molding compound are located between the first redistribution layer and the first die and aside the at least one second die and the at least one third die, and the through interlayer vias electrically connect the first redistribution layer and the at least one through via of the first die. The conductive elements are electrically connected to the first redistribution layer. The fourth die is electrically connected to the first redistribution layer and arranged aside the conductive elements.

According to some embodiments, a semiconductor package has a first redistribution layer, a first die, at least one second die, at least one third die, through interlayer vias and a molding compound. The first die includes at least one sensor and through vias therein, and the first redistribution layer is disposed under the first die. The second die and the third die are disposed on the first redistribution layer and between the first redistribution layer and the first die. The through interlayer vias are disposed on the first redistribution layer and between the first redistribution layer and the first die and are disposed aside the at least one second die and the at least one third die. Locations of the through vias are substantially aligned with locations of the through interlayer vias. The through vias of the first die are electrically connected with the through interlayer vias, and the through vias and the through interlayer vias are electrically connected to the first redistribution layer. The molding compound is disposed on the first redistribution layer and between the first redistribution layer and the first die, and the molding compound encapsulates the at least one second die, the at least one third die and the through interlayer vias.

According to some embodiments, a manufacturing method for semiconductor packages is provided. A wafer comprising first dies is provided on the carrier and each first die comprises at least one sensor and through vias therein. Through interlayer vias are formed over the first die and over the through vias. Locations of the through vias are substantially aligned with locations of the through interlayer vias. The through interlayer vias are electrically connected to the through vias. At least one second die and at least one third die are disposed over the first die and aside the through interlayer vias. A molding compound is formed over the first dies of the wafer and encapsulates the at least one second die, the at least one third die and the through interlayer vias. A first redistribution layer is formed on the molding compound. The through interlayer vias are electrically connected to the first redistribution layer. At least one fourth die is disposed on the first redistribution layer. The fourth die is electrically connected to the first redistribution layer. Conductive elements are disposed on the first redistribution layer. The carrier is removed from the wafer and a dicing process is performed to the wafer cutting through at least the wafer and the molding compound to separate the semiconductor packages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a first redistribution layer;
   a first die disposed over the first redistribution layer and having at least one through via therein, wherein the first die comprises at least one sensor;
   at least one second die and at least one third die, disposed on the first redistribution layer and between the first redistribution layer and the first die;
   a molding compound disposed on the first redistribution layer, between the first redistribution layer and the first die, and encapsulating the at least one second die and the at least one third die,
   through interlayer vias (TIVs) arranged through the molding compound, aside the at least one second die and the at least one third die, and between the first redistribution layer and the first die, wherein the TIVs electrically connect the first redistribution layer and the at least one through via of the first die;
   a dielectric material layer disposed on the molding compound and between the molding compound, the at least one second die, the at least one third die and the first die, wherein the dielectric material layer exposes the at least one through via and the through interlayer vias;
   conductive elements electrically connected to the first redistribution layer; and
   at least one fourth die electrically connected to the first redistribution layer and aside the conductive elements.

2. The semiconductor package as claimed in claim 1, wherein the at least one through via of the first die is in direct contact with the through interlayer vias in the molding compound.

3. The semiconductor package as claimed in claim 2, wherein the at least one sensor comprises at least one fingerprint sensor, at least one CMOS sensor or a combination thereof.

4. A semiconductor package comprising:
   a first redistribution layer;
   a first die disposed over the first redistribution layer and having at least one through via therein, wherein the first die comprises at least one sensor;
   at least one second die and at least one third die, disposed on the first redistribution layer and between the first redistribution layer and the first die;
   a molding compound disposed on the first redistribution layer, between the first redistribution layer and the first die, and encapsulating the at least one second die and the at least one third die,
   through interlayer vias (TIVs) arranged through the molding compound, aside the at least one second die and the at least one third die, and between the first redistribution layer and the first die, wherein the TIVs electrically connect the first redistribution layer and the at least one through via of the first die;
   a second redistribution layer disposed on the molding compound between the first die and the at least one second and the third dies, wherein the at least one through via and the through interlayer vias are connected to the second redistribution layer, and the first die is electrically connected to the second redistribution layer by the at least one through via;
   conductive elements electrically connected to the first redistribution layer; and
   at least one fourth die electrically connected to the first redistribution layer and aside the conductive elements.

5. The semiconductor package as claimed in claim 4, wherein the at least one sensor comprises at least one fingerprint sensor, at least one CMOS sensor or a combination thereof.

6. The semiconductor package as claimed in claim 1, wherein the fourth die comprises at least one passive component and connectors are located between the fourth die and the first redistribution layer for electrically connecting the fourth die and the first redistribution layer.

7. A semiconductor package comprising:
   a first die, comprising at least one sensor and through vias therein;
   a first redistribution layer, disposed under the first die;
   at least one second die and at least one third die, disposed on the first redistribution layer and between the first redistribution layer and the first die;
   through interlayer vias (TIVs) disposed on the first redistribution layer and between the first redistribution layer and the first die, and the TIVs being disposed aside the at least one second die and the at least one third die, wherein locations of the through vias are substantially aligned with locations of the through interlayer vias, the through vias of the first die are electrically connected with the through interlayer vias, and the through vias and the through interlayer vias are electrically connected to the first redistribution layer; and
   a molding compound, disposed on the first redistribution layer and between the first redistribution layer and the first die, wherein the molding compound encapsulates the at least one second die, the at least one third die and the through interlayer vias.

8. The semiconductor package as claimed in claim 7, wherein the at least one sensor of the first die includes a fingerprint sensor or an image sensor and one end of the through via is directly connected to the through interlayer via and the other end of the through via is electrically connected to the at least one sensor.

9. The semiconductor package as claimed in claim 8, further comprising conductive elements connected to the first redistribution layer and a dielectric material layer disposed on the molding compound and between the molding compound, the at least one second die, the at least one third die and the first die but exposing the through vias and the through interlayer vias.

10. The semiconductor package as claimed in claim 8, wherein active surfaces of the at least one second die and the at least one third die are connected to the first redistribution layer.

11. The semiconductor package as claimed in claim 7, further comprising a second redistribution layer disposed on the molding compound and between the molding compound, the at least one second die, the at least one third die and the first die, wherein the through vias and the through interlayer vias are connected to the second redistribution layer, and the first die is electrically connected to the second redistribution layer by the through via.

12. The semiconductor package as claimed in claim 11, wherein the at least one sensor of the first die includes a fingerprint sensor or an image sensor and one end of the through via is directly connected to the second redistribution layer and the other end of the through via is electrically connected to the at least one sensor and two opposite ends of the through interlayer vias are respectively connected to the first and second redistribution layers.

13. The semiconductor package as claimed in claim 11, wherein active surfaces of the at least one second die and the at least one third die are connected to the second redistribution layer.

14. A manufacturing method for semiconductor packages, comprising:
    disposing a wafer comprising first dies on a carrier and each first die comprising at least one sensor and through vias therein;
    forming through interlayer vias over the first die and over the through vias, wherein locations of the through vias are substantially aligned with locations of the through interlayer vias and the through interlayer vias are electrically connected to the through vias;
    disposing at least one second die and at least one third die over the first die and aside the through interlayer vias;
    forming a molding compound over the first dies of the wafer, encapsulating the at least one second die, the at least one third die and the through interlayer vias;
    forming a first redistribution layer on the molding compound, wherein the through interlayer vias are electrically connected to the first redistribution layer;
    disposing at least one fourth die on the first redistribution layer, wherein the at least one fourth die is electrically connected to the first redistribution layer;
    disposing conductive elements on the first redistribution layer; and
    removing the carrier from the wafer and performing a dicing process to the wafer, cutting through the wafer and the molding compound to separate the semiconductor packages.

15. The method as claimed in claim 14, further comprising forming a second redistribution layer on the first dies before forming the through interlayer vias, wherein the second redistribution layer is electrically connected to the through vias and the first dies, and the through interlayer vias are formed on the second redistribution layer and are electrically connected to the second redistribution layer.

16. The method as claimed in claim 14, wherein forming through interlayer vias over the first die comprises forming through interlayer vias directly on the through vias of the first dies, and the through interlayer vias are in direct contact with the through vias.

17. The method as claimed in claim 16, wherein further comprising forming a dielectric material layer on the first dies before forming the through interlayer vias, wherein the dielectric material layer covers the first dies but exposes the through vias.

18. The method as claimed in claim 14, further comprising disposing a protection layer on the semiconductor packages after performing a dicing process to the wafer.

19. The method as claimed in claim 14, wherein forming a molding compound over the first dies of the wafer, encapsulating the at least one second die, the at least one third die and the through interlayer vias comprises planarizing the molding compound to expose the through interlayer vias prior to forming the first redistribution layer.

20. The semiconductor package as claimed in claim 4, wherein the fourth die comprises at least one passive component and connectors are located between the fourth die and the first redistribution layer for electrically connecting the fourth die and the first redistribution layer.

* * * * *